(12) United States Patent
Cronie et al.

(10) Patent No.: US 9,015,566 B2
(45) Date of Patent: Apr. 21, 2015

(54) POWER AND PIN EFFICIENT CHIP-TO-CHIP COMMUNICATIONS WITH COMMON-MODE REJECTION AND SSO RESILIENCE

(71) Applicant: École Polytechnique Fédérale de Lausanne (EPFL), Lausanne (CH)

(72) Inventors: Harm Cronie, Lausanne (CH); Amin Shokrollahi, Preverenges (CH)

(73) Assignee: École Polytechnique Fédérale de Lausanne, Lausanne (CH)

( * ) Notice: Subject to any disclaimer, the term of this patent is extended or adjusted under 35 U.S.C. 154(b) by 0 days.

(21) Appl. No.: 14/028,240

(22) Filed: Sep. 16, 2013

(65) Prior Publication Data

US 2014/0016724 A1    Jan. 16, 2014

Related U.S. Application Data

(63) Continuation of application No. 12/982,777, filed on Dec. 30, 2010, now Pat. No. 8,539,318.

(60) Provisional application No. 61/351,845, filed on Jun. 4, 2010.

(51) Int. Cl.
*G06F 11/00* (2006.01)
*H04L 1/00* (2006.01)
*H03M 5/04* (2006.01)
(Continued)

(52) U.S. Cl.
CPC ............... *H04L 1/0041* (2013.01); *H03M 5/04* (2013.01); *H03M 5/16* (2013.01); *H03M 13/31* (2013.01); *H04L 1/0057* (2013.01); *H04L 2001/0094* (2013.01)

(58) Field of Classification Search
CPC ............ G06F 13/4072; G06F 13/4204; H04B 2203/5416
See application file for complete search history.

(56) References Cited

U.S. PATENT DOCUMENTS 5,166,956 A    11/1992  Baltus et al.
5,412,689 A     5/1995  Chan et al.
5,511,119 A     4/1996  Lechleider
(Continued)

FOREIGN PATENT DOCUMENTS

WO    2010031824    3/2010

OTHER PUBLICATIONS

David Slepian, Permutation Modulation, Proceedings of the IEEE, vol. 53, No. 3, 1965, pp. 228-236.
(Continued)

*Primary Examiner* — Charles Ehne
(74) *Attorney, Agent, or Firm* — Invention Mine LLC

(57) ABSTRACT

In bus communications methods and apparatus, a first set of physical signals representing the information to be conveyed over the bus is provided, and mapped to a codeword of a spherical code, wherein a codeword is representable as a vector of a plurality of components and the bus uses at least as many signal lines as components of the vector that are used, mapping the codeword to a second set of physical signals, wherein components of the second set of physical signals can have values from a set of component values having at least three distinct values for at least one component, and providing the second set of physical signals for transmission over the data bus in a physical form.

20 Claims, 21 Drawing Sheets

(51) Int. Cl.
*H03M 5/16* (2006.01)
*H03M 13/31* (2006.01)

(56) References Cited

U.S. PATENT DOCUMENTS

| | | |
|---|---|---|
| 5,553,097 A | 9/1996 | Dagher |
| 5,825,808 A | 10/1998 | Hershey et al. |
| 5,995,016 A | 11/1999 | Perino |
| 6,005,895 A | 12/1999 | Perino et al. |
| 6,359,931 B1 | 3/2002 | Perino et al. |
| 6,404,820 B1 | 6/2002 | Postol |
| 6,504,875 B2 | 1/2003 | Perino et al. |
| 6,556,628 B1 | 4/2003 | Poulton et al. |
| 6,661,355 B2 | 12/2003 | Cornelius et al. |
| 6,766,342 B2 | 7/2004 | Kechriotis |
| 6,839,429 B1 | 1/2005 | Gaikwad et al. |
| 6,990,138 B2 * | 1/2006 | Bejjani et al. ............... 375/146 |
| 6,999,516 B1 | 2/2006 | Rajan |
| 7,142,612 B2 | 11/2006 | Horowitz et al. |
| 7,167,019 B2 | 1/2007 | Broyde |
| 7,180,949 B2 | 2/2007 | Kleveland et al. |
| 7,184,483 B2 | 2/2007 | Rajan |
| 7,358,869 B1 | 4/2008 | Chiarulli et al. |
| 7,362,130 B2 | 4/2008 | Broyde et al. |
| 7,633,850 B2 | 12/2009 | Ahn |
| 7,656,321 B2 | 2/2010 | Wang |
| 7,706,524 B2 | 4/2010 | Zerbe |
| 7,746,764 B2 | 6/2010 | Rawlins et al. |
| 7,882,413 B2 | 2/2011 | Chen et al. |
| 7,933,770 B2 | 4/2011 | Kruger et al. |
| 8,091,006 B2 | 1/2012 | Prasad et al. |
| 8,159,375 B2 | 4/2012 | Abbasfar |
| 8,159,376 B2 | 4/2012 | Abbasfar |
| 8,279,094 B2 | 10/2012 | Abbasfar |
| 8,442,210 B2 | 5/2013 | Zerbe |
| 8,443,223 B2 | 5/2013 | Abbasfar |
| 8,462,891 B2 | 6/2013 | Kizer et al. |
| 8,588,280 B2 | 11/2013 | Oh et al. |
| 8,649,445 B2 | 2/2014 | Cronie et al. |
| 8,649,460 B2 | 2/2014 | Ware et al. |
| 2003/0071745 A1 | 4/2003 | Greenstreet |
| 2005/0152385 A1 | 7/2005 | Cioffi |
| 2006/0159005 A1 | 7/2006 | Rawlins et al. |
| 2007/0283210 A1 | 12/2007 | Prasad et al. |
| 2008/0273623 A1 | 11/2008 | Chung et al. |
| 2009/0185636 A1 | 7/2009 | Palotai et al. |
| 2010/0180143 A1 | 7/2010 | Ware et al. |
| 2010/0205506 A1 | 8/2010 | Hara |
| 2011/0235501 A1 | 9/2011 | Goulahsen |
| 2011/0268225 A1 | 11/2011 | Cronie et al. |
| 2011/0299555 A1 | 12/2011 | Cronie et al. |
| 2011/0302478 A1 | 12/2011 | Cronie et al. |
| 2013/0051162 A1 | 2/2013 | Amirkhany et al. |

OTHER PUBLICATIONS

Mircea Stan, et al., Bus-Invert Coding for Low-Power I/O, IEEE Transactions on VLSI Systems, vol. 3, No. 1, 1995, pp. 49-50.

Luca Tallini, et al., Transmission Time Analysis for the Parallel Asynchronous Communication Scheme, IEEE Transactions on Computers, vol. 52, No. 5, 2003, pp. 558-571.

International Search Report and Written Opinion for PCT/EP2011/002170 mailed Jul. 14, 2011.

International Search Report and Written Opinion for PCT/EP2012/052767 mailed May 11, 2012.

International Search Report and Written Opinion for PCT/EP2011/059279 mailed Sep. 22, 2011.

International Search Report and Written Opinion for PCT/EP2011/074219 mailed Jul. 4, 2012.

A.G. Burr, Spherical Codes for M-ARY Code Shift Keying, University of York, Apr. 2, 1989, pp. 67-72, United Kingdom.

Thomas Ericson et al., Spherical Codes Generated by Binary Partitions of Symmetric Pointsets, IEEE Transactions on Information Theory, vol. 41, No. 1, Jan. 1995, pp. 107-129.

Kamran Farzan et al., Coding Schemes for Chip-to-Chip Interconnect Applications, IEEE Transactions on Very Large Scale Integration (VLSI) Systems, vol. 14, No. 4, Apr. 2006, pp. 393-406.

Abbasfar, A. "Generalized Differential Vector Signaling," IEEE International Conference on Communications, ICC, Jun. 14, 2009, pp. 1-5.

Dasilva, et al., "Multicarrier Orthogonal CDMA Signals for Quasi-Synchronous Communication Systems", IEEE Journal on Selected Areas in Communications, vol. 12, No. 5, Jun. 1, 1994, pp. 842-852.

Wang et al., "Applying CDMA Technique to Network-on-Chip", IEEE Transactions on Very Large Scale Integration (VLSI) Systems, vol. 15, No. 10, Oct. 1, 2007, pp. 1091-1100.

Cheng, Wei-Chung, "Memory Bus Encoding for Low Power: A Tutorial" Quality Electronic Design, IEEE, International Symposium on Mar. 26-28, 2001, pp. 199-204, Piscataway, NJ.

* cited by examiner

| | | |
|---|---|---|
| 1 | 0 | .5946035575 |
| -1 | 0 | .594603557 |
| 0 | 1 | .594603557 |
| 0 | -1 | .594603557 |
| .7071067811 | .7071067811 | -.5946035575 |
| .7071067811 | -.7071067811 | -.5946035575 |
| -.7071067811 | .7071067811 | -.5946035575 |
| -.7071067811 | -.7071067811 | -.5946035575 |

Figure 9A

| | | |
|---|---|---|
| 0.1266109423 | 0.9635507195 | -0.2356685811 |
| -0.5918057918 | 0.7708607037 | 0.2356685811 |
| 0.0811204402 | 0.6173531063 | 0.7824925662 |
| -0.3791737544 | 0.4938953812 | -0.7824925662 |
| -0.9635507195 | 0.1266109423 | -0.2356685811 |
| -0.7708607037 | -0.5918057918 | 0.2356685811 |
| -0.6173531063 | 0.0811204402 | 0.7824925662 |
| -0.4938953812 | -0.3791737544 | -0.7824925662 |
| -0.1266109423 | -0.9635507195 | -0.2356685811 |
| 0.5918057918 | -0.7708607037 | 0.2356685811 |
| -0.0811204402 | -0.6173531063 | 0.7824925662 |
| 0.3791737544 | -0.4938953812 | -0.7824925662 |
| 0.9635507195 | -0.1266109423 | -0.2356685811 |
| 0.7708607037 | 0.5918057918 | 0.2356685811 |
| 0.6173531063 | -0.0811204402 | 0.7824925662 |
| 0.4938953812 | 0.3791737544 | -0.7824925662 |

Figure 9B $$H = \begin{bmatrix} 1 & 1 & 1 & 1 & 1 & 1 & 1 & 1 \\ 1 & -1 & 1 & -1 & 1 & -1 & 1 & -1 \\ 1 & 1 & -1 & -1 & 1 & 1 & -1 & -1 \\ 1 & -1 & -1 & 1 & 1 & -1 & -1 & 1 \\ 1 & 1 & 1 & 1 & -1 & -1 & -1 & -1 \\ 1 & -1 & 1 & -1 & -1 & 1 & -1 & 1 \\ 1 & 1 & -1 & -1 & -1 & -1 & 1 & 1 \\ 1 & -1 & -1 & 1 & -1 & 1 & 1 & -1 \end{bmatrix}$$

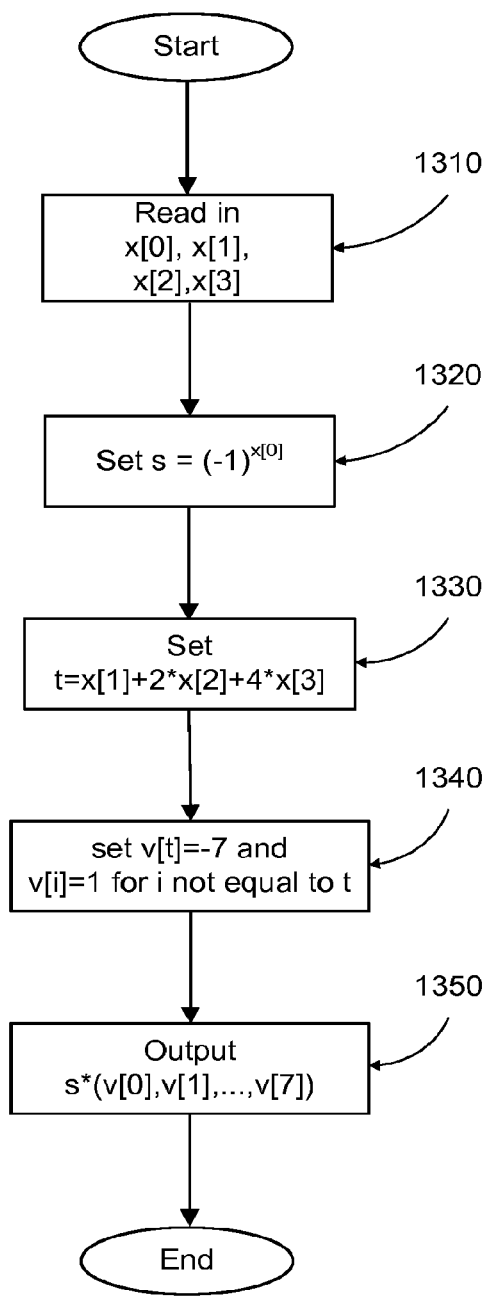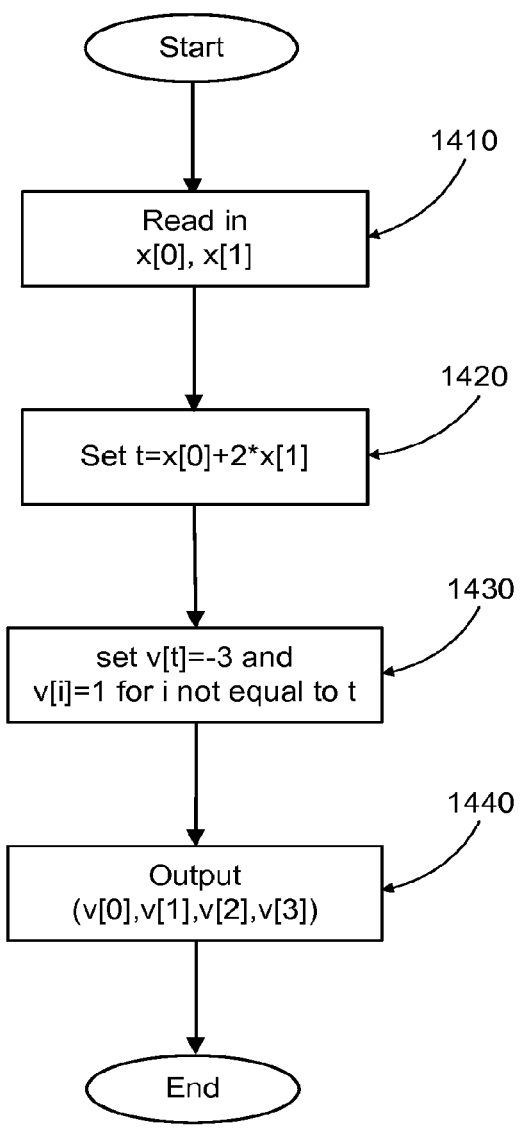
Figure 14
Figure 13

| I | n | $n_0$ | $n_1$ | $n_2$ | $A_0$ | $A_1$ | $A_2$ | e | FLAG[e] |
|---|---|---|---|---|---|---|---|---|---|
| 198 | 8 | 2 | 4 | 2 | 105 | 210 | 105 | 0 | 1 |
| 93 | 7 | 2 | 3 | 2 | 60 | 90 | 60 | 1 | 1 |
| 33 | 6 | 2 | 2 | 2 | 30 | 30 | 30 | 2 | 1 |
| 3 | 5 | 2 | 1 | 1 | 12 | 6 | 12 | 3 | 0 |
| 0 | 4 | 1 | 1 | 2 | 3 | 3 | 6 | 4 | 1 |
| 0 | 3 | 1 | 0 | 2 | 1 | 0 | 2 | 5 | 0 |
| 0 | 2 | 0 | 0 | 2 | 0 | 0 | 1 | 6 | 2 |
| 0 | 1 | 0 | 0 | 1 | 0 | 0 | 1 | 7 | 2 |

Figure 18

| [$n_0, n_1, n_2, n_3$] | delta | a | b | n | dB |
|---|---|---|---|---|---|
| [ 1, 1, 1, 0] | 1.000000 | 1.000000 | 2 | 3 | -3.01135354 |
| [ 1, 3, 0, 0] | 1.632993 | 1.224745 | 2 | 4 | 1.02902420 |
| [ 1, 2, 1, 0] | 1.224745 | 1.224745 | 3 | 4 | -1.74871343 |
| [ 1, 1, 1, 1] | 0.894427 | 1.341641 | 4 | 4 | -3.97994372 |
| [ 5, 1, 0, 0] | 1.549193 | 0.258199 | 2 | 6 | 0.42826155 |
| [ 4, 2, 0, 0] | 1.500000 | 0.500000 | 3 | 6 | 0.00121184 |
| [ 3, 3, 0, 0] | 1.632993 | 0.816497 | 4 | 6 | 0.79760035 |
| [ 1, 3, 2, 0] | 1.328422 | 1.549826 | 5 | 6 | -1.23383587 |
| [ 2, 2, 2, 0] | 1.224745 | 1.224745 | 6 | 6 | -2.02209587 |
| [ 1, 2, 2, 1] | 1.128152 | 1.692228 | 7 | 6 | -2.86930760 |
| [ 1, 7, 0, 0] | 1.851640 | 1.620185 | 3 | 8 | 2.03323549 |
| [ 2, 6, 0, 0] | 1.632993 | 1.224745 | 4 | 8 | 0.73330015 |
| [ 3, 5, 0, 0] | 1.632993 | 1.020621 | 5 | 8 | 0.68416034 |
| [ 4, 4, 0, 0] | 1.732051 | 0.866025 | 6 | 8 | 1.24584820 |
| [ 2, 5, 1, 0] | 1.560379 | 1.365332 | 7 | 8 | 0.32891704 |
| [ 1, 4, 3, 0] | 1.511858 | 1.889822 | 8 | 8 | -0.09787166 |
| [ 2, 3, 3, 0] | 1.358732 | 1.528574 | 9 | 8 | -1.17865194 |
| [ 1, 3, 3, 1] | 1.290994 | 1.936492 | 10 | 8 | -1.71160357 |
| [ 2, 2, 2, 2] | 1.048809 | 1.573213 | 11 | 8 | -3.89069720 |
| [ 1, 11, 0, 0] | 1.809068 | 1.658312 | 3 | 12 | 1.73506843 |
| [ 2, 10, 0, 0] | 1.897367 | 1.581139 | 6 | 12 | 2.09065958 |
| [ 1, 10, 1, 0] | 1.870829 | 1.870829 | 7 | 12 | 2.06764436 |
| [ 4, 8, 0, 0] | 1.732051 | 1.154701 | 8 | 12 | 1.11098689 |
| [ 2, 9, 1, 0] | 1.756620 | 1.610235 | 9 | 12 | 1.48970217 |
| [ 3, 8, 1, 0] | 1.651446 | 1.376205 | 10 | 12 | 0.85737987 |
| [ 2, 8, 2, 0] | 1.658312 | 1.658312 | 11 | 12 | 0.81748118 |
| [ 1, 6, 5, 0] | 1.603567 | 2.138090 | 12 | 12 | 0.34303973 |
| [ 4, 6, 2, 0] | 1.514634 | 1.262195 | 13 | 12 | -0.24000492 |
| [ 3, 6, 3, 0] | 1.527525 | 1.527525 | 14 | 12 | -0.14253866 |
| [ 1, 5, 5, 1] | 1.463850 | 2.195775 | 15 | 12 | -0.59817584 |
| [ 2, 5, 4, 1] | 1.358732 | 1.811643 | 16 | 12 | -1.41657314 |
| [ 3, 4, 4, 1] | 1.287842 | 1.609802 | 17 | 12 | -2.03285420 |
| [ 3, 4, 3, 2] | 1.192079 | 1.589439 | 18 | 12 | -2.90179536 |
| [ 3, 5, 5, 3] | 1.250000 | 1.875000 | 25 | 16 | -2.52402967 |

Figure 21

| 1 | 1.000000 | 2 | 3 | -3.01135354 |
|---|---|---|---|---|
| 2 | 1.224745 | 3 | 4 | -1.74871343 |
| 3 | 1.414214 | 4 | 5 | -0.48755815 |
| 4 | 1.414214 | 4 | 6 | -0.57277343 |
| 5 | 1.581139 | 4 | 7 | 0.48554421 |
| 6 | 1.581139 | 5 | 8 | 0.43778247 |
| 7 | 1.732051 | 6 | 9 | 1.40410470 |
| 8 | 1.732051 | 6 | 10 | 1.38283650 |
| 9 | 1.732051 | 6 | 11 | 1.38283650 |
| 10 | 1.870829 | 6 | 12 | 2.06190008 |
| 11 | 1.870829 | 6 | 13 | 2.06190008 |
| 12 | 1.870829 | 6 | 14 | 2.06190008 |
| 13 | 1.870829 | 6 | 15 | 2.06190008 |
| 14 | 1.870829 | 7 | 16 | 2.06190008 |

Figure 25

POWER AND PIN EFFICIENT CHIP-TO-CHIP COMMUNICATIONS WITH COMMON-MODE REJECTION AND SSO RESILIENCE

CROSS REFERENCES

This application is a Continuation of U.S. patent application Ser. No. 12/982,777 now U.S. Pat. No. 8,539,318 entitled "Power and Pin Efficient Chip-to-Chip Communications with Common-Mode Rejection and SSO Resilience" filed Dec. 30, 2010, which is a non-provisional application claiming priority to U.S. Provisional Patent Application No. 61/351,845 entitled "Error Control Coding for Differential Signaling" filed Jun. 4, 2010 naming Harm Cronie and Amin Shokrollahi (referred to herein as "Cronie II"), all of which are incorporated herein by reference.

The following prior applications are herein incorporated by reference in their entirety for all purposes: U.S. patent application Ser. No. 12/784,414 filed May 20, 2010 naming Harm Cronie and Amin Shokrollahi and entitled "Orthogonal Differential Vector Signaling" (referred to herein as "Cronie I");

The following references are cited in this application using the labels set out in brackets:

[Slepian] Slepian, D., "Permutation Modulation", Proceedings of the IEEE, Vol. 53, No. 3, pp. 228-236 (March 1965);

[Cornelius] U.S. Pat. No. 6,661,355 to William Cornelius and William Althas entitled "Methods and Apparatus for Constant-Weight Encoding & Decoding" (2003);

[Stan-Burelson] Stan, M., and Burelson, W., "Bus-Invert Coding for Low-power I/O", IEEE Transactions on VLSI systems, Vol. 3, No. 1, pp. 49-50 (March 1995); and

[Tallini] Tallini, L., and Bose, B., "Transmission Time Analysis for the Parallel Asynchronous Communication Scheme", IEEE Transactions on Computers, Vol. 52, No. 5, pp. 558-571 (2003).

FIELD OF THE INVENTION

The present invention relates to communications in general and in particular to transmission of signals capable of conveying information between integrated circuits.

BACKGROUND OF THE INVENTION

When an electronic device contains more than one integrated circuit ("IC"), signals typically need to be conveyed from chip to chip over a communication bus. Communication may also take place over a communication bus between two ICs that are part of two different devices. In either case, the communication bus might comprise one or more wires. The ICs might be mounted on a printed circuit board ("PCB") with the wires being striplines or microstrips. For communication between devices or boards, the wires might be the copper wires of a cable or optical fibers connecting the devices/boards. As is well known, the communication requires electrical energy and can generate electrical noise and errors can occur when the conditions of communication are not ideal.

For an increasing number of applications, the speed of the communication bus is a limiting factor. One way to increase the speed is to increase the number of wires that make up the bus. However, this also increases the number of pins of the ICs that are needed and many times, IC pins are a scarce resource. Another limiting factor is the power consumption of the bus and the circuitry driving the bus. Simply increasing the transmit power might not result in a better performance of the bus, because that might increase the amount of noise and lower performance.

Signals transmitted on a communication bus are subjected to several types of noise. One source of noise is thermal noise that can be modeled as independent Gaussian noise. The resilience against Gaussian noise can be improved by increasing signal swings or by the use of well-designed signaling schemes. Another type of noise is interference that may result from neighboring wires of the communication bus. Some noise and interference has a component that is common to the several wires of the bus and this noise is called common-mode noise. Another source of noise is simultaneous switching output ("SSO") noise that is caused by a bus driver current that varies in time. SSO noise can cause major problems in modern high-speed bus communication systems. Yet another source of noise is crosstalk noise, which is caused by interference of the signals on the different wires of the same bus. Crosstalk noise is one of the main sources of noise for high-frequency buses and is hard to eliminate by just increasing the energy of the signals on the bus, since an increase of energy leads directly to an increase of interference to nearby wires on the bus, and will lead to even worse crosstalk noise.

There are several approaches to signaling for chip-to-chip communications that may address one or more of the above constraints.

One approach is single-ended signaling where an information-carrying signal is transmitted on a single wire with respect to a common reference. Although single-ended signaling is efficient in terms of the number of wires used, it is susceptible to common-mode noise and it introduces SSO noise. Furthermore, for the detection of a single-ended signal, a reference is required at the receiver. Inaccuracies in the generation of the reference signal lead to higher error rates of the communication system. Hence, a signaling method that does not require a reference is preferred over a signaling method that does require one. Single-ended signaling is also not very efficient in terms of transmission power that is required to achieve certain Gaussian noise resilience, and it is also not efficient in terms of crosstalk noise.

Another signaling method is differential signaling. In differential signaling, an information-carrying signal is transmitted on a pair of wires. The original information-carrying signal is encoded into the difference between the signals transmitted on the pair of wires. The advantage of differential signaling is that it rejects noise that is common on both wires. For chip-to-chip communications, the information-carrying signal is often a non-return-to-zero ("NRZ") encoded signal and, as such, differential signaling does not introduce SSO. Another advantage is that differential signaling is less sensitive to interference and crosstalk. The reason for this is interference and crosstalk mainly couple into the common mode and are cancelled at the receiver. Moreover, in terms of resilience against Gaussian noise, differential signaling is more power-efficient compared to single-ended signaling. The main disadvantage of differential signaling is that it uses twice the number of pins compared to differential signaling.

The ratio between the number of bits transmitted in a cycle of time T and the number of bus wires is referred to as the pin efficiency of the bus. While communication buses based on differential signaling provide good noise resilience, their pin efficiency is low. Differential signaling is more power efficient than single-ended signaling but still a substantial amount of the power consumption of a bus communication system is used in the drivers of the bus wires.

One approach to addressing this issue is explained in Cronie I, which describes a method for bus communication that achieves a higher pin-efficiency than differential signaling while using less transmit power and provides resilience to common-mode noise and SSO noise. One approach described therein, referred to as "Orthogonal Differential Vector Signaling" or "ODVS", achieves a pin-efficiency that is close to one when the number of wires is large. In some applications, it is preferable to increase the noise resilience of a communication system as described above at the expense of the pin-efficiency.

Cronie II teaches a method referred to as "Coded Differential Vector Signaling" or "COVECS" that uses methods of forward error correction to use some of the pins saved by ODVS to increase the noise resilience.

While the methods of Cronie I and Cronie II offer substantial improvements regarding the tradeoff of pin-efficiency and noise resilience as compared to other approaches, there are some applications wherein additional improvements are possible. For example, since embodiments of ODVS might use a number of wires that are a power of two, applications where that is not a convenient number of wires might need another approach.

With the methods of Cronie II, improving the noise resilience of the system might use up a significant number of pins saved by ODVS and the circuitry needed for encoding and decoding according to the teachings of Cronie II may be complex and may not be applicable in situations where the data transfer is of very high rate, thus requiring another approach.

Another application is where the pin-efficiency needs to exceed one. What is needed is a method that provides a wider range of possible pairs of pin-efficiency and noise resilience, allows for very efficient encoding and decoding, and leads to new tradeoffs between pin-efficiency and noise resilience.

BRIEF SUMMARY OF THE INVENTION

In methods and apparatus for bus communications according to aspects of the present invention, a first set of physical signals representing the information to be conveyed over the bus is provided, and mapped to a codeword of a spherical code, wherein a codeword is representable as a vector of a plurality of components and the bus uses at least as many signal lines as components of the vector that are used, mapping the codeword to a second set of physical signals, wherein components of the second set of physical signals can have values from a set of component values having at least three distinct values for at least one component, and providing the second set of physical signals for transmission over the data bus in a physical form.

In an specific embodiment, the spherical code is a sparse permutation modulation code and the operation of mapping the first set of physical signals to a codeword of the permutation modulation code further comprises accessing a storage location for a generating vector, selecting a distinguished position of the generating vector of the permutation modulation code, mapping the first set of physical signals to a first sequence of bits, subdividing the first sequence of bits into a second sequence of bits and a third sequence of bits, comparing the second sequence and the third sequence and putting a first predetermined value into the distinguished position of the generating vector if the second sequence and third sequence satisfy a predetermined relation, and putting a second predetermined value into a second position of the generating vector different from the distinguished position, wherein the second position is obtained from the second sequence using a predetermined process, when the second sequence and third sequence do not satisfy the predetermined relation, putting a first predetermined value into a first position of the generating vector obtained from the second sequence, and putting a second predetermined value into a second position of the generating vector obtained from the third sequence, and putting a third predetermined value into all the positions of the generating vector that are not equal to the first position or the second position.

The following detailed description together with the accompanying drawings will provide a better understanding of the nature and advantages of the present invention.

BRIEF DESCRIPTION OF THE DRAWINGS

FIG. 9 provides examples of spherical codes as might be used by the code map unit of FIG. 7; FIG. 9a gives an example of spherical codes in three dimensions and size 8; FIG. 9b gives an example of spherical codes in three dimensions and size 16.

FIG. 13 is a flowchart of an example encoding process for encoding input bits into a vector signal that can be used on the communication bus.

FIG. 14 is a flowchart of another example encoding process for encoding input bits into a vector signal that can be used on the communication bus.

FIG. 18 is a chart of values that might be stored in memory or generated in various steps of the process illustrated in FIG. 17, for various example inputs.

FIG. 21 is a table of values that might occur during the decoding process of FIG. 20.

FIG. 25 is a table of values that might be used for sparse PM coding.

DETAILED DESCRIPTION OF THE INVENTION

Figure 1:
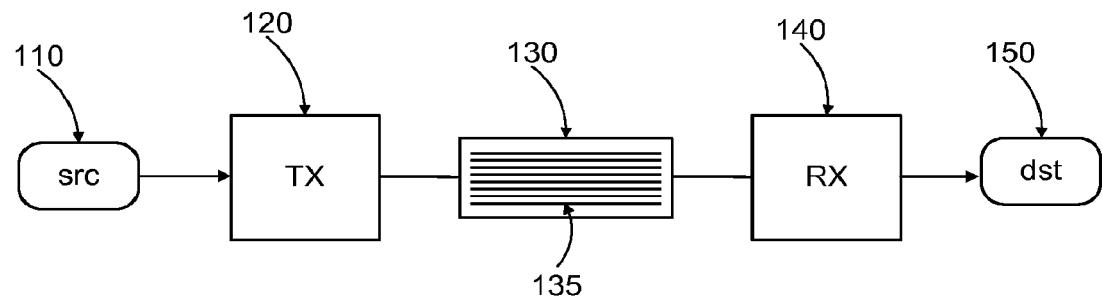
FIG. 1 illustrates an environment in which the present invention might be used.

FIG. 1 illustrates an environment in which the present invention might be used. As illustrated there, an information source 110 provides a sequence of k information symbols periodically, at an interval of T seconds, for example. Without loss of generality, assume that these information symbols are bits. These bits are to be transmitted by a bus transmitter 120 over a communication bus 130 to a bus receiver 140 at a destination 150. The communication bus 130 comprises n physical wires 135.

In the case where the n physical wires are easily allowed for and the transmission of k/Tn bits per second on each wire does not create noise problems, no special circuit would be needed—each T seconds, k/n bits could be placed on a wire and sent from source to destination. However, there are many cases where the number of physical wires needs to be kept low and/or simply transmitting whatever bits are present at the source would cause noise sufficient to introduce errors for the values of k/T that are needed for the particular use.

Examples of communication bus 130 might include a bus between a processor and memory, wherein the physical wires take the form of striplines or microstrips on a printed circuit board ("PCB") and the processor is the source for some information bits (while the memory is the destination) and the memory is the source for other information bits (while the processor is the destination). Another example of a communication bus 130 is a set of wires connecting two devices. Generally, the methods disclosed herein are applicable for a wide variety of communication buses. Some buses operate using electrical signals that are added to the wires by controlling voltage changes, whereas others are added to the wires by controlling current changes, and in yet others, the wires conduct light (and possibly not electricity) and the signals are optical signals imposed on optical fibers or other light-conducting medium. Striplines and microstrips typically operate with electrical signals.

In operation, the information bits of source 110 are fed to a bus transmitter 120, which has the task of transforming those bits into a set of physical signals that can be transmitted on bus 130. At the other end of bus 130, bus receiver 140 maps the received signals back to information bits for use at destination 150.

Figure 2:
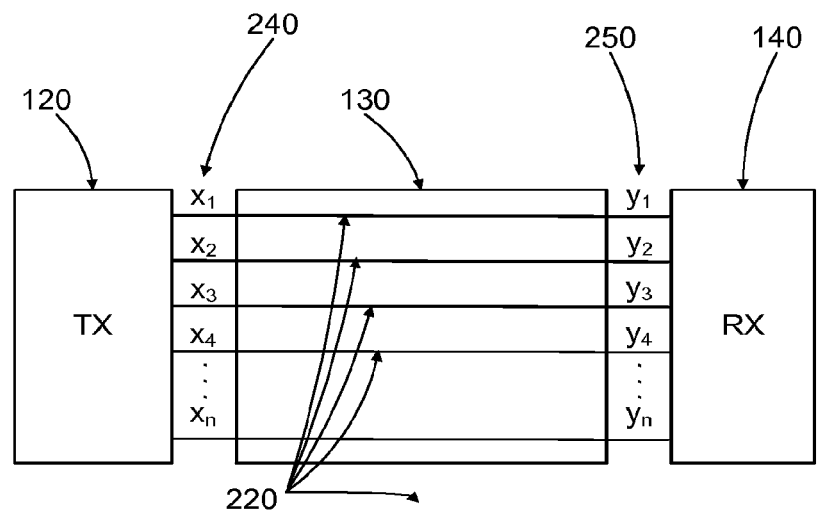
FIG. 2 is a schematic diagram illustrating the communication bus of FIG. 1 in greater detail.

FIG. 2 is a schematic diagram illustrating communication bus 130 in greater detail. As illustrated there, bus 130 comprises l wires 220. Bus transmitter 120 generates a set of n waveforms 240, which are labeled $x_1(t)$ to $x_n(t)$ (and collectively as x(t)) and can represent voltage signals, current signals and/or optical signals. In this example, n is some integer greater than 5, but it should be understood that it could be four, eight, 64, 256 or some integer that is not a whole power of two, for example three. The waveforms 250 that are received at bus receiver 140 might not be exactly the same as waveforms 240, due to shifting of signals, amplification, shifting, noise and other effects. The received signals are labeled herein as $y_1(t)$ to $y_n(t)$ (and collectively as y(t)). The main task of the bus receiver is to recover the original information bits based on the waveforms $y_1(t)$ to $y_n(t)$. To facilitate this process, the bus transmitter 120 and the bus receiver 140 may perform several tasks such as amplification, filtering, demodulation, synchronization, equalization, and bus termination.

Noise Effects

As explained herein, there are novel techniques described here for addressing issues of common-mode noise rejection, resilience against SSO noise, resilience against Gaussian noise, and favorable properties with respect to crosstalk noise.

Common-mode Noise: Where there is a noise signal that disturbs x(t) such that each wire is affected in the same way, the received signals might be represented as $y_i(t)=x_i(t)+c(t)$, for i=1, 2, . . . , n, where c(t) denotes the common-mode noise signal. Of course, it is assumed that the bus receiver does not exactly know c(t).

SSO Noise: Simultaneous Switching Output ("SSO" noise) is typically caused when the circuitry that drives the bus wires has a power consumption that varies over time. The instantaneous power consumption, P(t), of driver circuitry is typically proportional to the sum of the squares of the amplitudes of the signals on each individual wire.

Model of Vector Signal Encoder that Addresses Common-Mode and SSO Noise

As explained elsewhere herein, a vector signal encoder that obtains some of information bits to be conveyed and generates a signal for a plurality of lines, i.e., a "vector signal", can often provide common-mode noise resilience by having the sum of the components of the vector signal sum to zero, i.e., by satisfying Equation 1.

$$\sum_{i=1}^{n} x_i(t)=0 \qquad \text{(Eqn. 1)}$$

Where the vector signal might contribute to SSO noise, this can be reduced by maintaining a constant total power consumption of the bus drivers, which can be expressed as shown in Equation 2, wherein $P_0$ is a constant related to the energy of the signals.

$$\sum_{i=1}^{n} x_i^2(t)=P_0 \qquad \text{(Eqn. 2)}$$

Example Vector Signal Encoder

Figure 3:
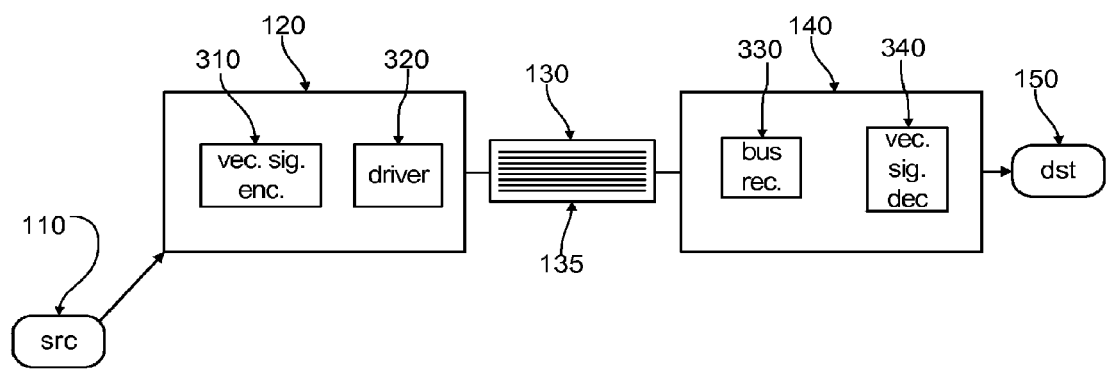
FIG. 3 is a schematic diagram illustrating the environment of FIG. 1 wherein a vector signal encoder and a vector signal decoder are used.

FIG. 3 is a schematic diagram illustrating use of a vector signal encoder and a vector signal decoder. Bus transmitter 120 might include a vector signal encoder 310 and a bus driver 320, while bus receiver 140 might include a vector signal decoder 340 and a bus receiver 330. Vector signal encoder 310 preferably encodes the information provided by source 110 such that Equations 1 and 2 hold.

Figure 4:
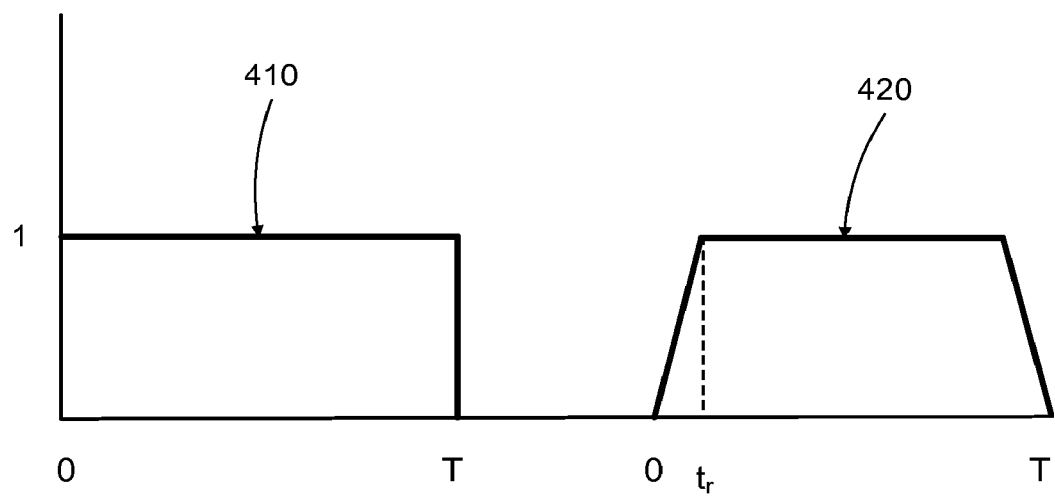
FIG. 4 is a signal plot illustrating a signaling scheme that might be used on the bus lines of FIG. 3.

In one example, vector signal encoder 310 uses a form of vector pulse amplitude modulation, wherein a basic pulse shape, p(t), with a finite duration of T seconds is defined and the amplitude of this pulse is modulated according to a signaling scheme. Two examples of pulse shapes are shown in FIG. 4. The left hand-side of FIG. 4 shows a rectangular pulse 410 of duration T. Pulse 410 is often used as an approximation for modeling purposes. A more practical pulse 420 is shown in the right hand-side of FIG. 4. Pulse 420 has a finite rise time, $t_r$. In one preferred embodiment, vector signal encoder 310 generates a signal, $x_i(t)=c_i p(t)$, for each i-th symbol period of duration T, where $c_i$ is a real number defining the pulse for that symbol period. Herein, the label "c" refers to a vector containing the $c_i$ values and the set of all possible such c is denoted by C. Herein, the set C is referred to as the signal constellation. In embodiments where this form of pulse amplitude modulation is used, Equation 1 and Equation 2 reduce to Equation 3 and Equation 4, respectively.

$$\sum_{i=1}^{n} c_i = 0 \quad \text{(Eqn. 3)}$$

$$\sum_{i=1}^{n} c_i^2 = P_0 \quad \text{(Eqn. 4)}$$

Figure 5:
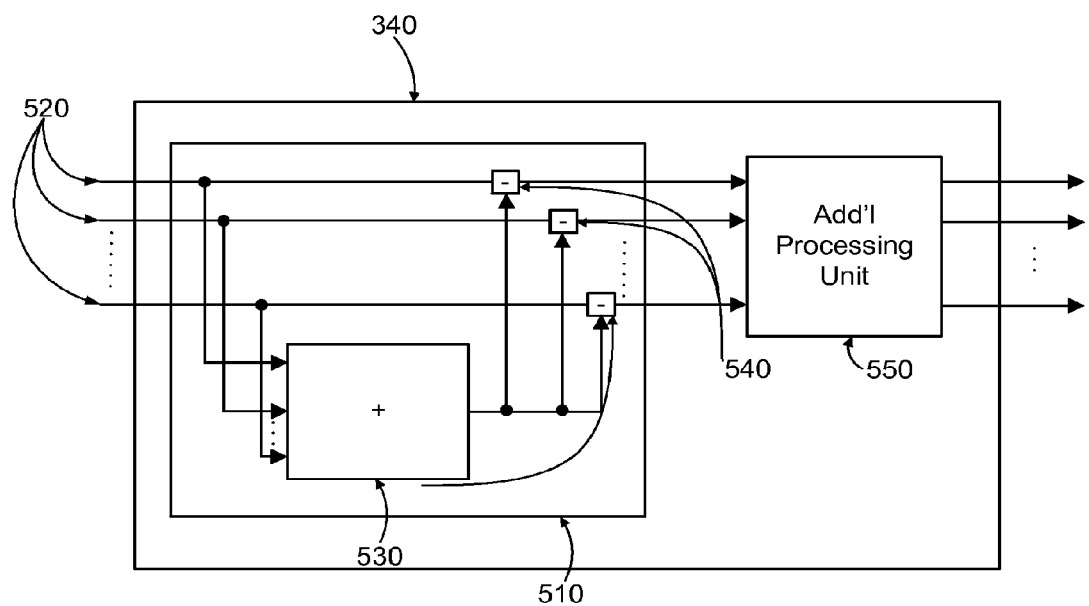
FIG. 5 is a block diagram illustrating the vector signal decoder of FIG. 3 in greater detail.

FIG. 5 illustrates an example of a vector signal decoder 340 that incorporates a common-mode cancellation unit 510, and effectively satisfies Equation 1. A set of signals 520 enters vector signal decoder 340 and an adder 530 computes their sum. The sum is fed to a set of subtractors 540 (which can be differential circuits) that "subtract" the sum signal (or a proportion of the sum signal) from each of the signals 520 entering the vector signal decoder. As a result, common-mode noise is cancelled if it is common on the entire width of the bus.

In addition to common-mode noise and SSO noise, which can be addressed by particular circuits, there is also Gaussian noise, which is independently added to the signals on the bus, and external interference, which is added to the signals that traverse the bus. A bus can be made resilient to those types of noise, as explained herein, by proper selection of the signaling on the bus. As is known, resilience can be obtained by ensuring that the possible values of the vector c have a large Euclidean distance from one other. To that end, vector signal decoder 340 may include an additional processing unit 550 that decodes the set of received signals to the corresponding original information bits, while having signal constellations, C, with a good minimal distance while satisfying Equation 1 and 2.

Figure 6:
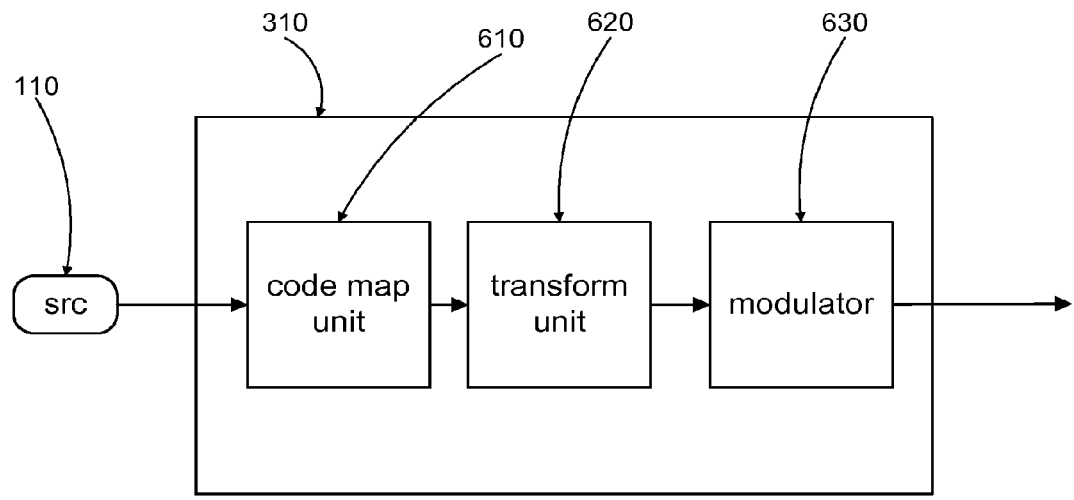
FIG. 6 is a block diagram illustrating the vector signal encoder of FIG. 3 in greater detail.

One preferred embodiment of a vector signal encoder 310 is exemplified in FIG. 6. The input to vector signal encoder 310 is a sequence of k source bits that are to be transmitted on the bus with l wires in a time interval of T seconds. The vector signal encoder 310 may include a code map unit 610, a transform unit 620 and a modulator 630.

Code map unit 610 takes the k source bits as its input and generates n values, which can be either real or complex numbers, such that the sum of the squares of the absolute values of these numbers is a given constant, or belongs to a small set of possible values.

Transform unit 620 takes as its input the n values from the code map unit and transforms these values to another set of n values, where the transformation is as explained further below. Modulator 630 modulates the output of transform unit 620 to create the signals for the bus lines. An example might be pulse amplitude modulation according to a predefined pulse shape, p(t), that results in signals corresponding to $x_1(t)$ to $x_n(t)$, which are sent to bus driver 320 to be transmitted on the bus.

The values sent on the bus are carefully chosen so as to maximize or increase their robustness to various types of noise as described above. This can be accomplished by a proper choice of code map unit 610 and transform unit 620. For example, code map unit 610 may generate the values in such a way that the vectors generated have good mutual distance properties with respect to Euclidean distance so as to provide resilience against Gaussian and thermal noise. Furthermore, code map unit 610 may be configured to ensure that every vector is of equal Euclidean norm so that Equation 2 is satisfied. Transform unit 620 may be such that after the transform, the mutual distance properties of the input vectors are preserved and Equation 1 is satisfied.

Examples and preferred embodiments of code map unit 610 and transform unit 620 will now be described, with reference to FIGS. 7-12.

Code Map Unit

Figure 7:
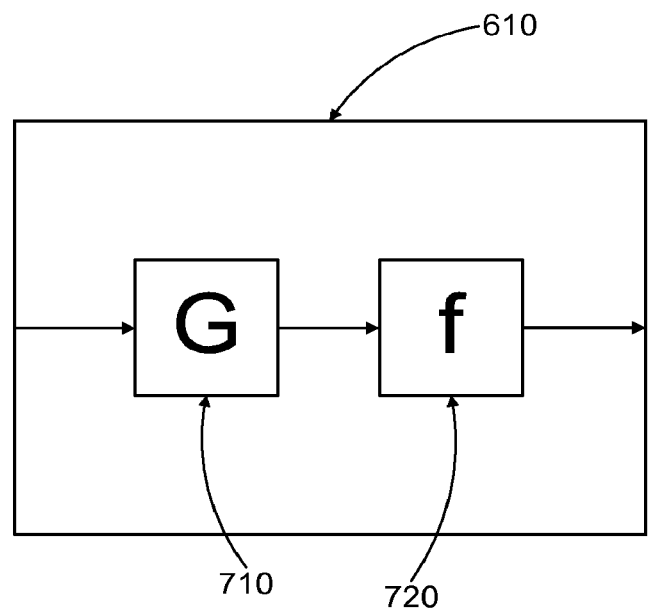
FIG. 7 is a block diagram illustrating functionality of the code map unit of FIG. 6.

An example code map unit is shown in FIG. 7, comprising a mechanism to apply a generator matrix, G, of a binary error-correcting code to the vector of input bits, s, from the source to obtain a vector of bits c, as set out in Equation 5.

$$c = Gs \quad \text{(Eqn. 5)}$$

The resulting vector c is provided to unit 720, which applies a map, $f$, to the individual components of the vector c. There are many choices for such a map, and depending on the underlying application, one choice may be preferred over another.

For example, if the signals transmitted on communication bus 130 belong to the set $\{-1, +1\}$, then the map $f$ might be defined by $f(x) = (-1)^x$ for a bit x. If communication bus 130 allows for transmission of signals belonging to a set of size larger than two, the map $f$ may have a different form; for example, it could take pairs of bits and map them to one of the elements of a predefined set of four elements, or it may take triples of bits and map them to one of the elements of a predefined set of eight elements, etc. Where $f$ is of the form above, the output of vector signal encoder 610 is a vector v that is given by $v = f(c)$ wherein $f(c)$ is understood as the vector for which the i-th entry is the application of $f$ to the i-th entry of c. Upon straightforward calculation, it should be apparent that the components of v satisfy Equation 2 with a value of $P_0$ being equal to the number of entries of the vector c. Furthermore, there are ample of possibilities to choose G such that the resulting vectors have good mutual distance properties. An example of a matrix G for k=4 and n=7 is shown by Equation 6, which happens to the generator matrix of the binary [7,4,3] Hamming code. Other options are possible.

$$G = \begin{bmatrix} 1 & 0 & 0 & 0 & 0 & 1 & 1 \\ 0 & 1 & 0 & 0 & 1 & 0 & 1 \\ 0 & 0 & 1 & 0 & 1 & 1 & 0 \\ 0 & 0 & 0 & 1 & 1 & 1 & 1 \end{bmatrix} \quad \text{(Eqn. 6)}$$

In general, if the generator matrix of a code of length n, dimension k, and minimum Hamming distance d is used, then the minimum Euclidean distance between any two distinct vectors generated by signal encoder 610 is twice the square root of the Hamming distance, whereas the energy (i.e., Euclidean norm) of every vector generated is the square root of n, and thus the ratio between the minimum distance and the Euclidean norm of the generated vectors is as shown in Equation 7.

$$2\sqrt{\frac{d}{n}} \quad \text{(Eqn. 7)}$$

Therefore, if a small minimum distance is desired, then the chosen code should have a large minimum Hamming distance compared to n.

Figure 8:
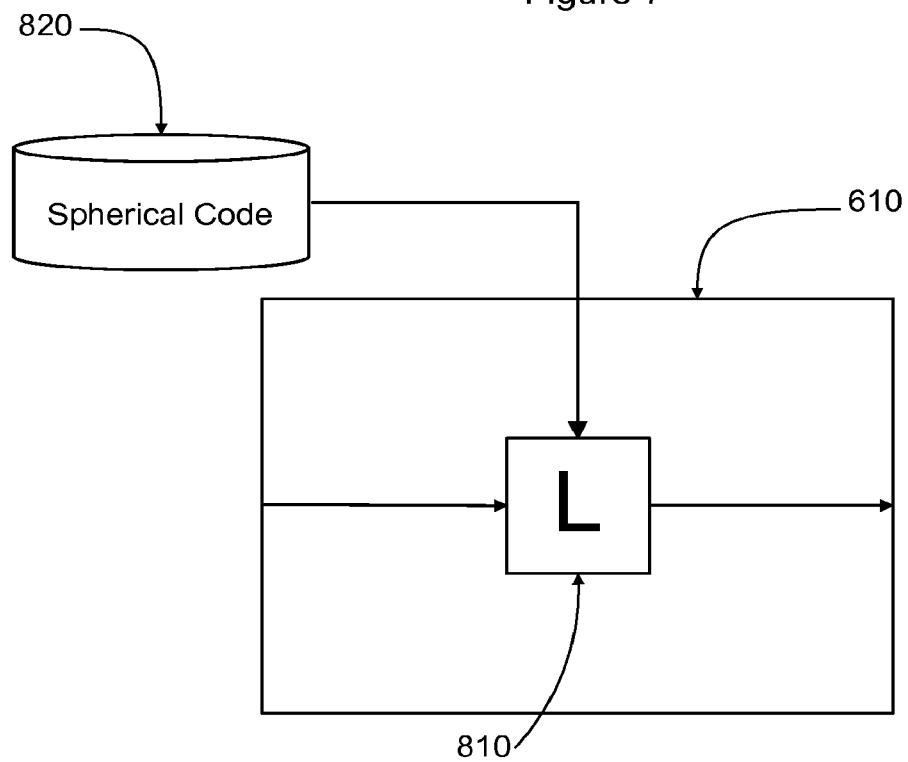
FIG. 8 is a block diagram illustrating functionality of an alternative code map unit that can be used in the vector signal encoder of FIG. 6.

FIG. 8 is a block diagram illustrating functionality of an alternative code map unit that can be used in the vector signal encoder. It comprises a spherical code unit 820 and a spherical encoder L. The vector of input bits is given to spherical encoder 810 which, based on the input vector and the spherical code 820, outputs one of the elements of the spherical code. As is known to those of skill in the art, a spherical code is a finite set of vectors of equal norm in the n-dimensional Euclidean space. Often, it is required that the minimum Euclidean distance between the elements of the spherical code is large, so that small perturbations of said elements do not result in confusion of one for another. There are many examples of spherical codes known to those of skill in the art. For example, the four vertices of a regular tetrahedron on the unit sphere in three dimensions is a spherical code given by Equation 8. The minimum Euclidean distance between these vectors is the square root of 8, which is considered to be very large.

$$\text{Vertices} = \left\{ \frac{1}{\sqrt{3}}(1, 1, 1), \frac{1}{\sqrt{3}}(-1, 1, -1), \frac{1}{\sqrt{3}}(1, -1, -1), \frac{1}{\sqrt{3}}(-1, -1, 1) \right\} \quad \text{(Eqn. 8)}$$

FIGS. 9a and 9b give further examples of spherical codes in dimension 3 of sizes 8 and 16, respectively. The elements in FIG. 9a all have norm approximately equal to 1.16342285. Those in FIG. 9b have norm approximately equal to 0.942858. These spherical codes have a property that the minimum Euclidean distance between the vectors is rather large. These spherical codes are well-known to researchers in fields related to the transmission of information on noisy channels, such as wireless communication, satellite communication, communication on a modem line, and the like. Other spherical codes are possible.

When using spherical codes in applications, a process needs to determine, for every given vector of bits that is used, a unique element of the spherical code associated with that particular vector of bits. Herein "spherical code encoding process" is used to refer to that process.

Spherical coding is a general case of the encoding performed by the encoder of FIG. 7. In that case, the possible outputs of the function f form a spherical code. In the situation of FIG. 7, the spherical code encoding process uses an encoding process for the underlying code. In case of general spherical codes, the encoding process can be more elaborate and may depend on the particular spherical code used. Such a procedure might comprise a table matching every possible array of bits of a specified length with one of the elements of the spherical code. For example, for the regular tetrahedron above, the mapping could be as shown in Table 1 (where "s" represents the square root of three).

TABLE 1

| Input Bits | Vector |
|---|---|
| 00 | [1, 1, 1]/s |
| 01 | [-1, 1, -1]/s |
| 10 | [1, -1, -1]/s |
| 11 | [-1, -1, 1]/s |

Using the teachings herein, tables can be created for other spherical codes (such as those illustrated by FIGS. 9a and 9b) as well. One of the disadvantages of some encoding methods is the amount of memory they use, for storing an indication of an element of the spherical code for each possible sequence of input bits. Where the number of elements in the spherical code is small, for example, 4, 8, or 16, such an encoding method may be possible to use without sacrificing resources such as area, storage, or speed. In other cases, it may be prudent to use spherical codes that are equipped with fast encoders, and also fast decoders. Permutation modulation codes, as described below, provide such a class and may be used in embodiments of bus systems according to the present invention.

Differential Signaling, Single-Ended Signaling, and Spherical Codes

Differential signaling and single-ended signaling are known and can be viewed as special cases of signaling using spherical codes, as explained below. In the case of single ended signaling on n wires, the signals transmitted on these wires are of the form $(a_1, \ldots, a_j)$ where the entries of this vector can independently take on one of two possible values. The set of such elements constitutes a spherical code according to the definitions above, and herein this particular spherical code is referred to as a "hypercube" code.

In the case of differential signaling on 2 n wires, the signals transmitted on these wires are of the form $(a_1, -a_1, a_2, -a_2, \ldots, a_n, -a_n)$ where each of the entries $a_j$ is an element from a set $\{b, -b\}$. The set of such elements constitutes a spherical code according to the definitions above, and herein this particular spherical code is referred to as a "reflected hypercube" code.

The Transform Unit

Figures 10, 11:
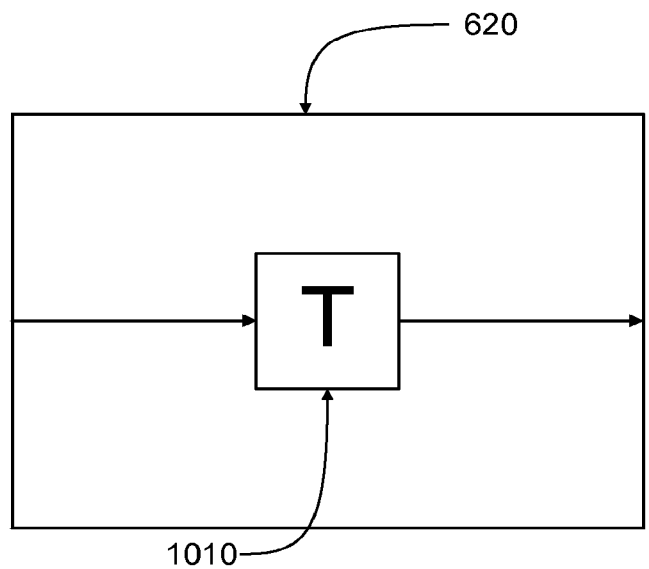
FIG. 10 is a block diagram illustrating functionality of the transform unit of FIG. 6.
FIG. 11 is an illustration of an example Hadamard matrix that might be used by the transport unit of FIG. 10.

An example transform unit is given in FIG. 10. Transform unit 620 may comprise circuits or elements that perform a transform defined by a matrix T. The matrix T may have the property that its columns are all of Euclidean norm one, and are mutually orthogonal, and that the sum of the rows of the matrix has substantially more zeros than non-zeroes, such as at least as many zeroes as non-zeroes, or at least two or three or more times as many zeroes. For example, the matrix T may have the property that the sum of its rows is zero in all coordinate positions except possibly the first. Cronie I contains examples of such matrices. One class of examples is furnished by Hadamard matrices. An example of such a matrix is given in FIG. 11.

If the matrix T has the property that the sum of its rows is zero in all except possibly in the first position, then in one embodiment, the transform unit 620 may form a vector, v', from the vector v as shown by Equation 9.

$$v' \begin{bmatrix} 0 \\ v_1 \\ \vdots \\ v_{n-1} \end{bmatrix} \quad \text{(Eqn. 9)}$$

In this embodiment, the transform unit 620 will apply the matrix T directly to v' to obtain $x_1(t)$ to $x_n(t)$.

Combined Code Map Unit and Transform Unit

In several cases, the combination of a binary-error correcting code or an appropriate spherical code with a transform leads to a signal constellation wherein each vector is a permutation of some base vector $x_0$. As an example, consider a vector signal encoder that employs the binary [7, 4, 3] Hamming code for its code map unit, and employs the Hadamard matrix of size 8 of FIG. 11 for its transform unit. The code map unit and the transform unit define the signal set that is shown FIG. 12. The resulting signal vectors are permutations of the vectors [-7, 1, 1, 1, 1, 1, 1, 1] and -[-7, 1, 1, 1, 1, 1, 1, 1].

Figure 12:
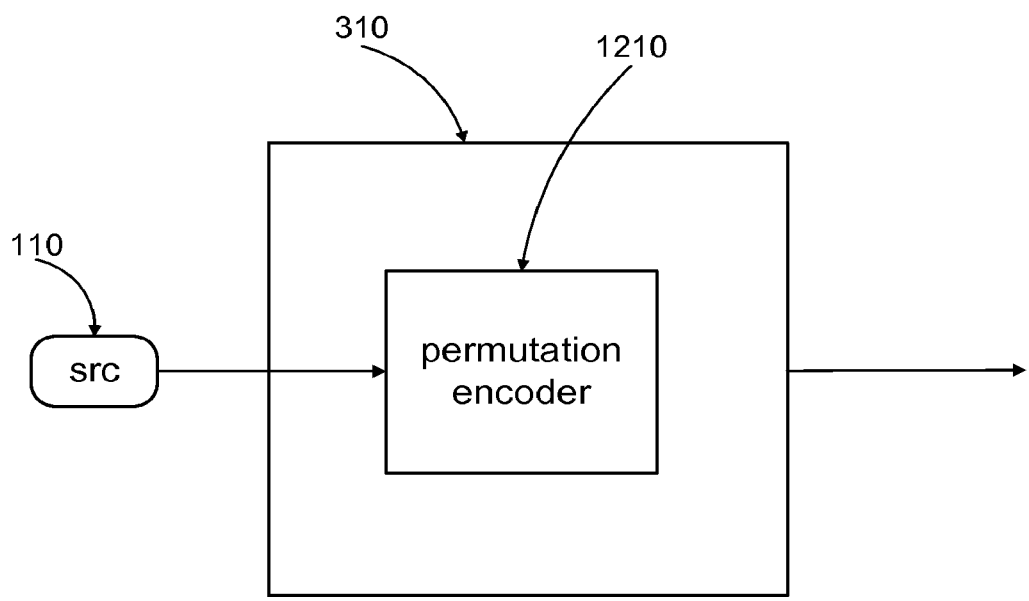
FIG. 12 is a block diagram illustrating an embodiment of the vector signal encoder of FIG. 3 in greater detail.

A spherical code for which all the elements are permutations of a single base element is called a "permutation modulation code." These codes are explained further in [Slepian] and since they are known, some details of them need not be described herein. Thus, the Hamming code and the Hadamard transform described above define a permutation modulation code. In one embodiment, the code map unit and the transform unit are combined into a single permutation encoder 1210, as shown in FIG. 12. In the example above, permutation encoder 1210 may apply the map shown in Table 2 to generate a signal vector from a set of four bits.

TABLE 2

| Input Bits | Vector in $R^n$ |
|---|---|
| 0000 | [−7, 1, 1, 1, 1, 1, 1, 1] |
| 0001 | [1, −7, 1, 1, 1, 1, 1, 1] |
| 0010 | [1, 1, −7, 1, 1, 1, 1, 1] |
| 0011 | [1, 1, 1, −7, 1, 1, 1, 1] |
| 0100 | [1, 1, 1, 1, −7, 1, 1, 1] |
| 0101 | [1, 1, 1, 1, 1, −7, 1, 1] |
| 0110 | [1, 1, 1, 1, 1, 1, −7, 1] |
| 0111 | [1, 1, 1, 1, 1, 1, 1, −7] |
| 1000 | −[−7, 1, 1, 1, 1, 1, 1, 1] |
| 1001 | −[1, −7, 1, 1, 1, 1, 1, 1] |
| 1010 | −[1, 1, −7, 1, 1, 1, 1, 1] |
| 1011 | −[1, 1, 1, −7, 1, 1, 1, 1] |
| 1100 | −[1, 1, 1, 1, −7, 1, 1, 1] |
| 1101 | −[1, 1, 1, 1, 1, −7, 1, 1] |
| 1110 | −[1, 1, 1, 1, 1, 1, −7, 1] |
| 1111 | −[1, 1, 1, 1, 1, 1, 1, −7] |

A process for performing this encoding efficiently is shown in FIG. 13. There, the input bits x[0], x[1], x[2], x[3] are read in (from memory or some other input) (step 1310). In step 1320, a variable s is calculated where s=−1 if x[0]=1, and s=0 otherwise. Thereafter, an index t is calculated in step 1330. This index is a number between 0 and 7, and its bit-representation is given by (x[1], x[2], x[3]). In step 1340, the entry with index t of the output vector is set to −7, and all other indices are set to one. Finally, in step 1350 the vector s*(v[0], v[1], . . . , v[7]) is returned.

In yet another embodiment, the code vector signal encoder may employ a code map unit defined by the vertices of the tetrahedron and a Hadamard transform of size 4. This combination results in a permutation modulation code where the elements of $x_0$=[−3, 1, 1, 1] are permuted based on the input bits. In an embodiment, the permutation encoder 1210 may generate the signal vectors directly by mapping pairs of bits to signal vectors as defined in Table 3.

TABLE 3

| Input Bits | Vector in $R^n$ |
|---|---|
| 00 | [−3, 1, 1, 1] |
| 01 | [1, −3, 1, 1] |
| 10 | [1, 1, −3, 1] |
| 11 | [1, 1, 1, −3] |

A process for performing this encoding efficiently is shown in FIG. 14. There, the input bits x[0], x[1] are provided to the process in step 1410. In step 1420, an index t is calculated that is a number between 0 and 3, and has a bit-representation given by (x[0], x[1]). In step 1430, the entry with index t of the output vector is set to −3, and all other indices are set to one. Finally, in step 1440, the vector (v[0], v[1], v[2], v[3]) is returned.

Figure 15:
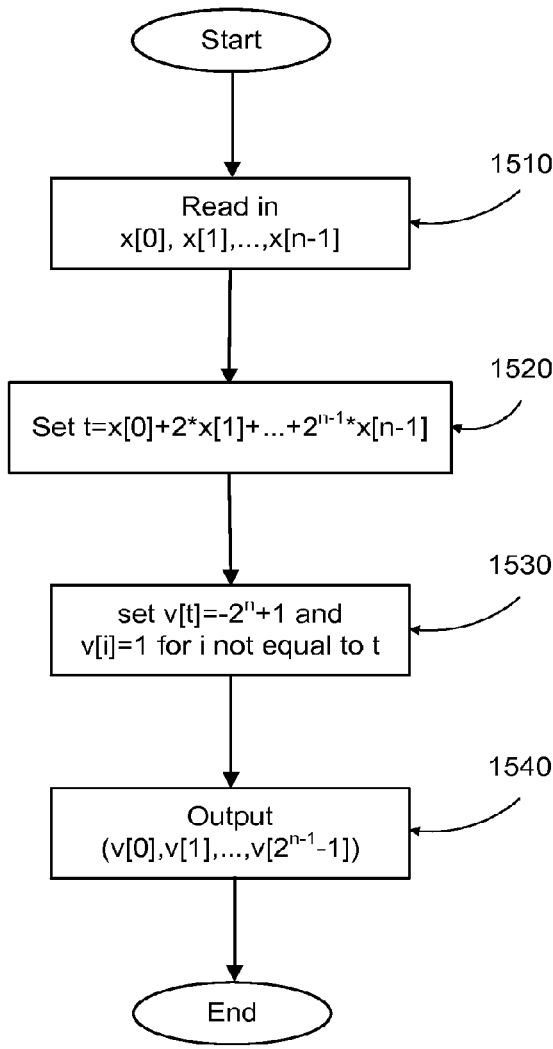
FIG. 15 is a flowchart of an example of a lower pin-efficiency encoding process for encoding input bits into a vector signal that can be used on the communication bus.

The two examples given above lead to coded vector signaling methods with a pin-efficiency of 0.5. Other similar coded vector signaling methods can be obtained using this procedure, albeit at the expense of a lower pin-efficiency. Such a procedure is described with reference to FIGS. 15 and 16. The input 1510 to the process in FIG. 15 is a sequence of n bits denoted x[0], . . . , x[n−1]. In step 1520, these bits are interpreted as the binary expansion of an integer t and this integer is calculated. In step 1530, the entry t of the output vector v is set to the value −$2^n$+1 and all other values are set to 1. This vector is output in step 1540. The pin-efficiency of this procedure is $n/2^n$. For n=2, this leads to the tetrahedron map of FIG. 14 with a pin-efficiency of 0.5.

Figure 16:
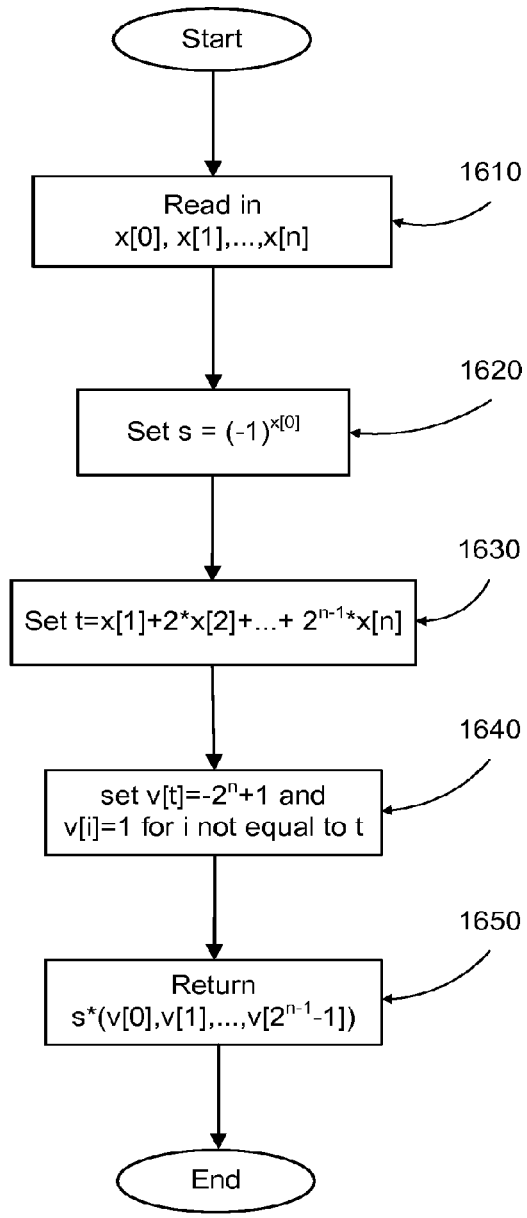
FIG. 16 is a flowchart of another example of a lower pin-efficiency encoding process for encoding input bits into a vector signal that can be used on the communication bus.

The input to the process in FIG. 16 is a sequence of n+1 bits denoted x[0], . . . , x[n]. In step 1620, a variable s is calculated where s=−1 if x[0]=1, and s=1 otherwise. In step 1630, the sequence x[1], x[2], . . . , x[n] is interpreted as the binary expansion of an integer t, and this integer is calculated. In step 1640, the entry t of the output vector v is set to the value −($2^n$)+1 and all other values are set to 1. This vector is output in step 1650. The pin-efficiency of this procedure is $(n+1)/2^n$. For n=3, this leads to the Hamming map of FIG. 13 with a pin-efficiency of 0.5.

In specific applications, the vectors of the spherical code obtained may be multiplied with the same scaling factor that accounts for the transmit energy of the signals. The output of the processes in FIGS. 13-16 may therefore, in certain applications, undergo a further step in which all the entries of the output vector are multiplied by a common constant value.

Permutation Modulation Codes

The use of a code map unit and the transform unit leads to several signal sets that satisfy Equation 1 and 2. Furthermore, these signal sets have a good noise performance. Several of these schemes result in permutation modulation codes. As mentioned above, a permutation modulation code (hereinafter "PM code" for short) is a spherical code in which all elements are permutations of a basic vector $x_0$. The basic vector $x_0$ is called the "generator" of the PM code, and the PM code is said to be generated by $x_0$. Because of this property, Equation 2 above is always satisfied for the elements of a PM code. Moreover, the sum of the coordinates of $x_0$ is 0, then Equation 1 above is also always satisfied for the elements of a PM code. In preferred embodiments, the vector $x_0$ has the shape shown in Equation 10, where $n_0, n_1, \ldots, n_t$ are positive integers summing up to the number n of coordinates of $x_0$, and where $a_0, a_1, \ldots, a_t$ are real numbers $a_0 > a_1 > \ldots > a_t$ such that Equation 11 is satisfied.

$$x_0 = (\underbrace{a_0, \ldots, a_0}_{n_0} | \underbrace{a_1, \ldots, a_1}_{n_1} | \ldots | \underbrace{a_t, \ldots, a_t}_{n_t}) \quad \text{(Eqn. 10)}$$

$$n_0 a_0 + n_1 a_1 + \ldots + n_t a_t = 0 \quad \text{(Eqn. 11)}$$

It should be apparent from reading this disclosure that the elements of the PM code generated by $x_0$ can be enumerated by the different partitions of the set $\{1, 2, \ldots, n\}$ into subsets of sizes $n_0, n_1, \ldots, n_t$. Therefore, the PM code generated by $x_0$ has $n!/(n_0! n_1! \ldots n_t!)$ elements.

Figure 17:
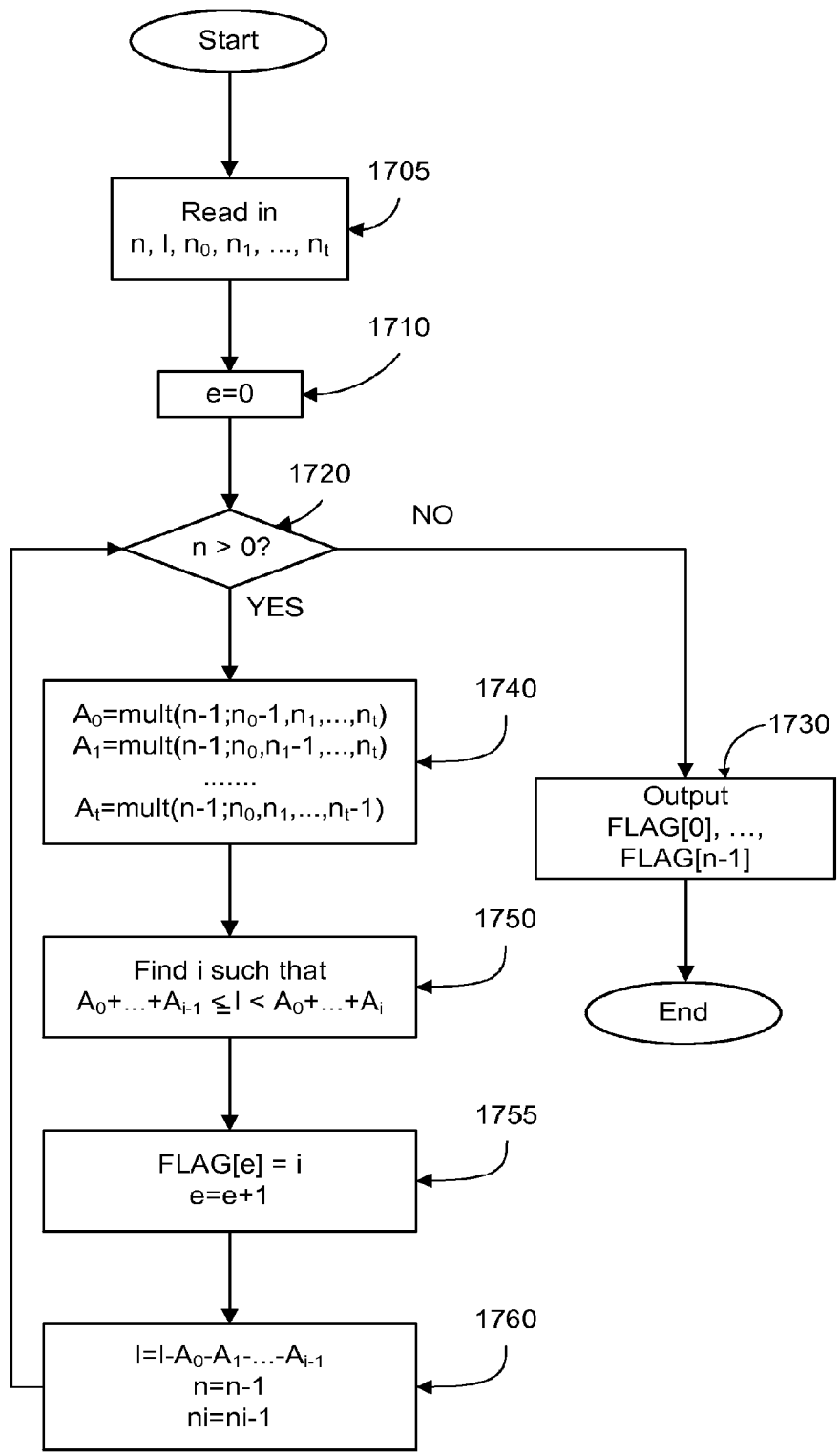
FIG. 17 is a flowchart illustrating an encoding process for a PM code.

The encoding procedure for a PM code described in this way is quite simple and will be described with reference to FIGS. 17 and 18. For convenience of the presentation, the function mult(n; $n_0, n_1, \ldots, n_t$) is defined to be equal to $n!/(n_0! n_1! \ldots n_t!)$ if none of the $n_i$ is negative, and equal to zero if at least one of the $n_i$ is equal to zero. Given a sequence x[0], . . . , x[m] of bits such that m is smaller than or equal to the binary logarithm of mult(n; $n_0, n_1, \ldots, n_t$), the encoding of this sequence starts by interpreting the bit sequence as the binary representation of an integer l as l=x[0]+ 2x[1]+ . . . +$2^m$x[m]. The inputs to the procedure described in FIG. 17 are the integer l to be encoded, and the integers $n_0$, $n_1, \ldots, n_t$. The additional input n is redundant as it is the sum of $n_0, n_1, \ldots, n_t$. However, it has been added as an input for simplifying the presentation. The output of the procedure in FIG. 18 is a set of flags FLAG[0], FLAG[1], ..., FLAG[n−1]. The interpretation of this output is as follows: The i-th element of the vector is equal to $a_s$ where s=FLAG[i].

In step 1710, a variable, e, is set to zero. In step 1720, a decision is made as to whether n is still positive or not. If not, then the process stops at step 1730 and outputs the values FLAG[0], FLAG[1], ..., FLAG[n−1]. If n is still positive, then in step 1740, the quantities $A_0, \ldots, A_t$ are calculated using the function mult( ) described above. Thereafter, in step 1750, an integer i in the set $\{0, 1, \ldots, t-1\}$ is found such that the expression of Equation 12 is satisfied.

$$A_0+A_1+\ldots+A_{i-1} \leq l \leq A_0+A_1+\ldots+A_i \qquad \text{(Eqn. 12)}$$

Then, in step 1755, the flag FLAG[e] is set to i, and the counter e is incremented by 1. In step 1760, the value of l is reduced by $A_0+A_1+\ldots+A_{i-1}$, that of n and $n_i$ by one. At this point, the process goes back to step 1720 again.

An example of the procedure in FIG. 17 is now described with reference to FIG. 18. In this example, the input to the procedure is given by l=198, n=8, $n_0$=2, $n_1$=4, and $n_2$=2. In every row of FIG. 18, the values of the variables l, n, $n_0$, $n_1$, $n_2$, e, and FLAG[e] are given at the end of step 1755 of FIG. 17. The output is the FLAG vector (1, 1, 1, 0, 1, 0, 2, 2), corresponding to the element ($a_1, a_1, a_1, a_0, a_1, a_0, a_2, a_2$).

A demodulator for a PM code implements a procedure that maps a given element of the PM code to its corresponding bit-representation, wherein the corresponding bit-representation is the sequence of bits which, upon using the procedure of FIG. 17, yield the subset.

A demodulator for PM codes is now described with reference to FIG. 19. The input to this process, given in step 1905, are the integers n, $n_0, n_1, \ldots, n_t$, and the vector FLAG for which FLAG[e] is the index of the subset to which coordinate position e belongs. The output of this process is an integer l greater than or equal to zero, and smaller than mult(n; $n_0$, $n_1, \ldots, n_t$). In step 1910, a counter, e, is set to zero, as is the current value of the variable l. In step 1920, a decision is made as to whether n is still positive. If not, then the process stops at step 1930 and outputs the value l. If n is still positive, then in step 1940, the quantities $A_0, \ldots, A_t$ are calculated using the function mult( ) described above. Thereafter, in step 1950, the integer i is set to the value of FLAG[e] and l is incremented by $A_0+A_1+\ldots+A_{i-1}$. In step 1960, the values of n and of $n_i$ are reduced by one and the value of the counter e is incremented by one. At this point, the process returns to step 1920.

Decoding PM Codes

One reason for using PM codes is the existence of a simple procedure for decoding elements of such codes when they are subjected to various types of noise. A decoding process for PM codes is now described with reference to FIG. 20. The input to this process, shown in step 2005, is a vector ($y_0$, $y_1, \ldots, y_{n-1}$) of real numbers. In some embodiments, this vector may be what has been received by unit 140 of FIG. 1 after transmission of an element of a PM code on the wires 135. In such embodiments, this vector constitutes a perturbed version of the element of the PM code that was sent by transmitter 120. The task of the decoding process in FIG. 20 is to determine the bit-representation of the transmitted element wherein the bit-representation of the element is the representation giving rise to the input l of the process in FIG. 17.

As used herein, it should be understood that when a decoding process or other process is performed or has a task, that performance or task is performed by hardware circuits, by software executed by as special-purpose or general purpose processor, but that in the case of small, fast circuits, the process is likely performed by special purpose hardware elements. Not all of the elements of each possible hardware element are shown or described herein. In many cases, once the functionality of a process or elements are fully described, implementation in hardware is straightforward for circuits designers.

Figure 20:
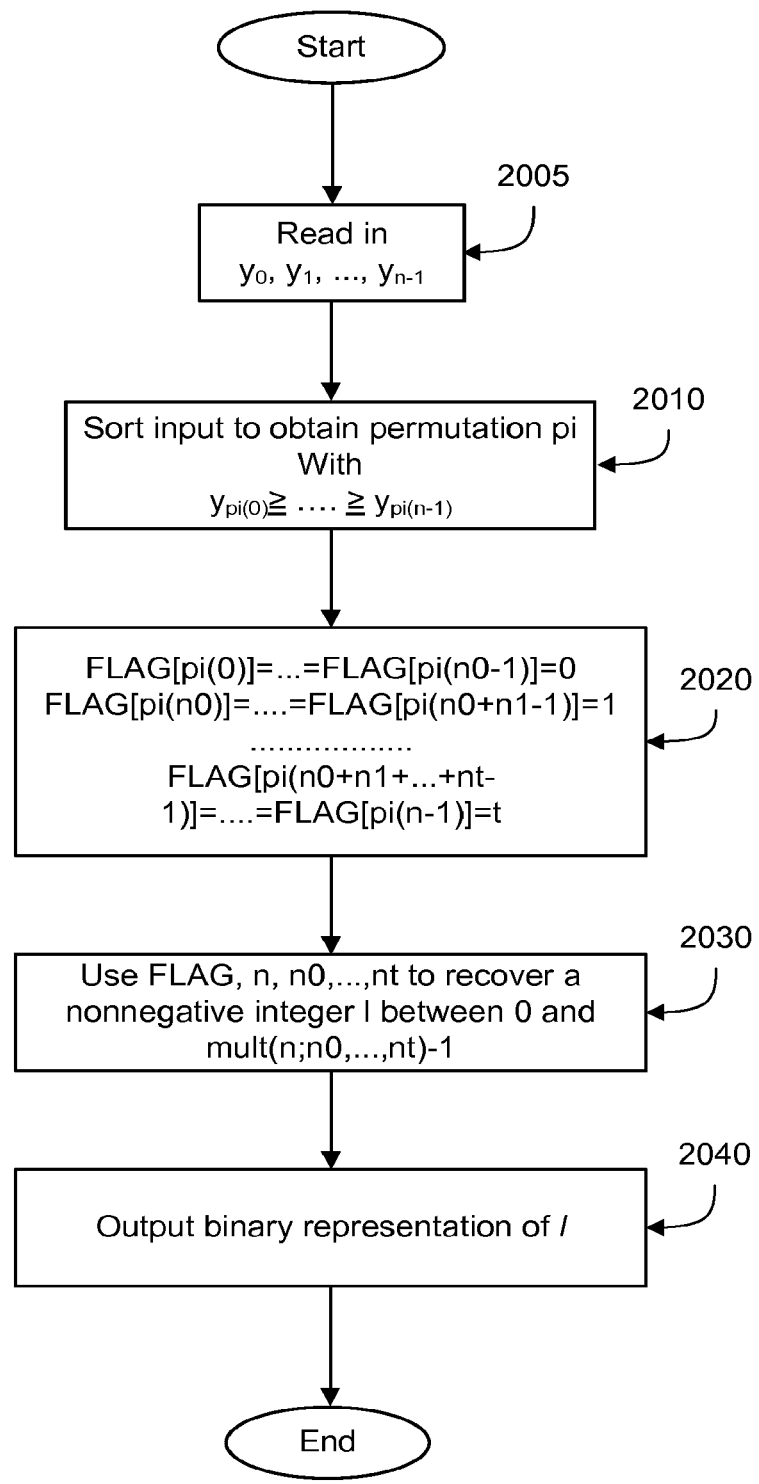
FIG. 20 is a flowchart illustrating a decoding process for a PM code.

In step 2010 of the decoding process in FIG. 20, the elements $y_0, y_1, \ldots, y_{n-1}$ are sorted, and a permutation, pi, of the set $\{0, 1, \ldots, n-1\}$ is obtained such that Equation 13 is satisfied.

$$y_{pi(0)} \geq y_{pi(1)} \geq \ldots \geq y_{pi(n-1)} \qquad \text{(Eqn. 13)}$$

Thereafter, in step 2020, a vector FLAG comprising n entries is obtained, wherein Equations 14(0)-14(t) are satisfied.

$$\text{FLAG}[pi(0)] = \ldots = \text{FLAG}[pi(n_0 - 1)] = 0 \qquad \text{(Eqn. 14(0))}$$

$$\text{FLAG}[pi(n_0)] = \ldots = \text{FLAG}[pi(n_0 + n_1 - 1)] = 1 \qquad \text{(Eqn. 14(1))}$$

...

$$\text{FLAG}[pi(n_0 + n_1 + \ldots + n_{t-1})] = \ldots = \text{FLAG}[pi(n - 1)] = t \qquad \text{(Eqn. 14(t))}$$

In step 2030, this vector FLAG is used to recover an integer l. The procedure for recovering l is in similar to the procedure in FIG. 19. The output of process of FIG. 20 is the binary representation of l.

Optimized PM Codes

It is straightforward to calculate the probability of error of the process in FIG. 20 under the assumption that the individual entries of the PM code element transmitted on the wires 135 are subjected to Gaussian noise of mean 0 and a given variance. Based on such calculation, a best basic vector corresponding to a given value of t can be determined. The table in FIG. 21 gives some of these optimized PM codes. Other examples are possible, with values of t=3 or other values of t. In these examples the basic vector $x_0$ is of the form shown in Equation 15.

$$x_0 = (\underbrace{a, \ldots, a}_{n_0}, \underbrace{a-\delta, \ldots, a-\delta}_{n_1}, \qquad \text{(Eqn. 15)}$$

$$\underbrace{a-2\delta, \ldots, a-2\delta}_{n_2}, \underbrace{a-t\delta, \ldots, a-t\delta}_{n_3})$$

The first entry in the table is the vector [$n_0$, $n_1$, $n_2$, $n_3$]. The second and the third entries are the numbers δ and a, respectively. The fourth entry is the number of bits that can be transmitted with this PM code, and the fifth entry is equal to the number n (which is the sum of $n_0$, $n_1$, $n_2$, $n_3$). In selected embodiments, this is the number of wires 135. The last column in the table is the power improvement in dB compared to differential signaling of the same number of bits (over possibly a larger number of wires).

As can be seen from these examples, it is possible to use PM codes that lead to pin-efficiencies that are much larger than the pin-efficiency of differential signaling (which is 0.5) and are more power efficient. For example, it is possible to transmit 6 bits over 8 wires and use only roughly 70% of the energy required for sending the same number of bits using differential signaling. This method can be combined with a lowering of the transmission speed per wire to obtain a transmission that has the same throughput as differential signaling, but uses significantly less energy. Alternatively, by increasing the transmission speed per wire, it is possible to obtain a transmission that is faster than differential signaling by a factor of 2, and uses roughly the same energy. Another example is the transmission of 12 bits on 12 wires. This scheme has the same pin-efficiency as single ended signaling, but uses less than half the energy of the latter. Yet another example is the last entry of the table. Here, it is possible to transmit 25 bits on 16 wires, hence achieving a pin-efficiency of 25/16, or 1.5625. The corresponding transmission scheme would use less than half the energy of single ended signaling, which achieves a pin-efficiency of 1.0.

Many other examples can be found upon reading this disclosure that lead to even higher pin-efficiencies and yet are more energy efficient than the single ended signaling method.

Sparse PM Codes

In a variety of applications, it is beneficial to have a PM code generated by a sparse vector, i.e., by a vector containing many zeroes. For example, where the vector is of length n but has only d non-zero entries, wherein d is smaller than n, only d of the wires need to be driven at any point in time, and hence the total current or voltage used could be significantly reduced. For example, if the basic vector has only two non-zero coordinates, and these are equal to some real number a and its negative $-a$, a procedure similar to differential signaling could be used to drive the voltages through the two wires corresponding to these nonzero positions. Using the corresponding PM code would enable transmission of about $2*\lg(n)$ many bits, where $\lg(n)$ is the binary logarithm of n. For values of n that are not too large, the number of voltage carrying (and hence energy consuming) wires is significantly reduced with respect to differential signaling, while keeping the pin-efficiency to at least 0.5.

Another reason for using sparse PM codes in some embodiments is to deal with crosstalk. This source of noise appears when information is transmitted on a bus at very high frequencies and is the primary source of noise at such frequencies. For sparse PM codes, crosstalk typically leads to the erroneous excitation of wires that carry zero voltage. Often, this excitation appears as Gaussian noise when decoding the signals. Since the PM code is designed to have good resistance against such noise, sparse PM codes typically show good robustness against crosstalk.

Figure 19:
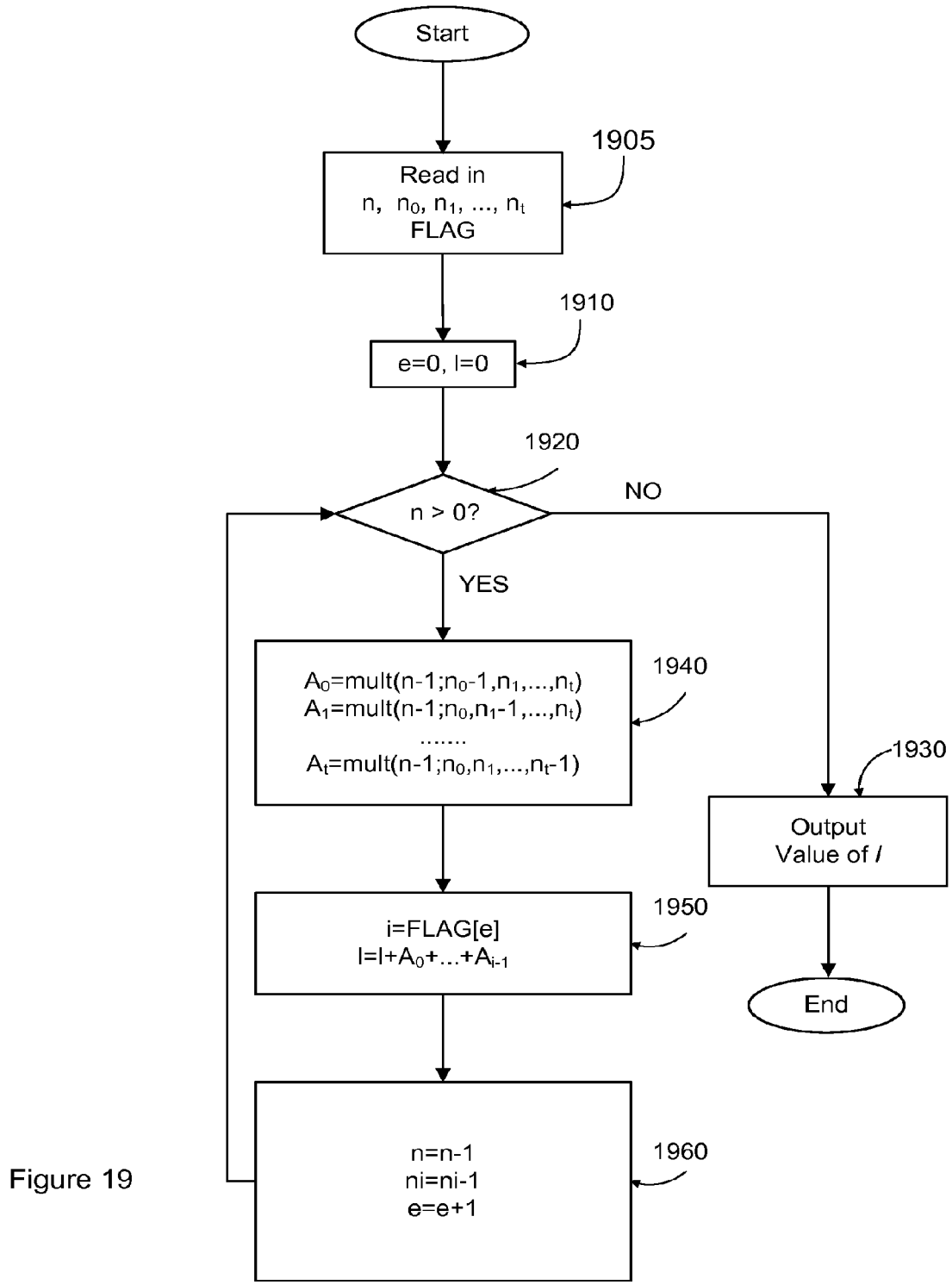
FIG. 19 is a flowchart illustrating a demodulating process for a PM code.

For these reasons, benefits are obtained with an encoding procedure and a decoding procedure for sparse PM codes that are simpler and require less computational resources than the procedures outlined in FIG. 17 and in FIG. 19.

Figure 22A:
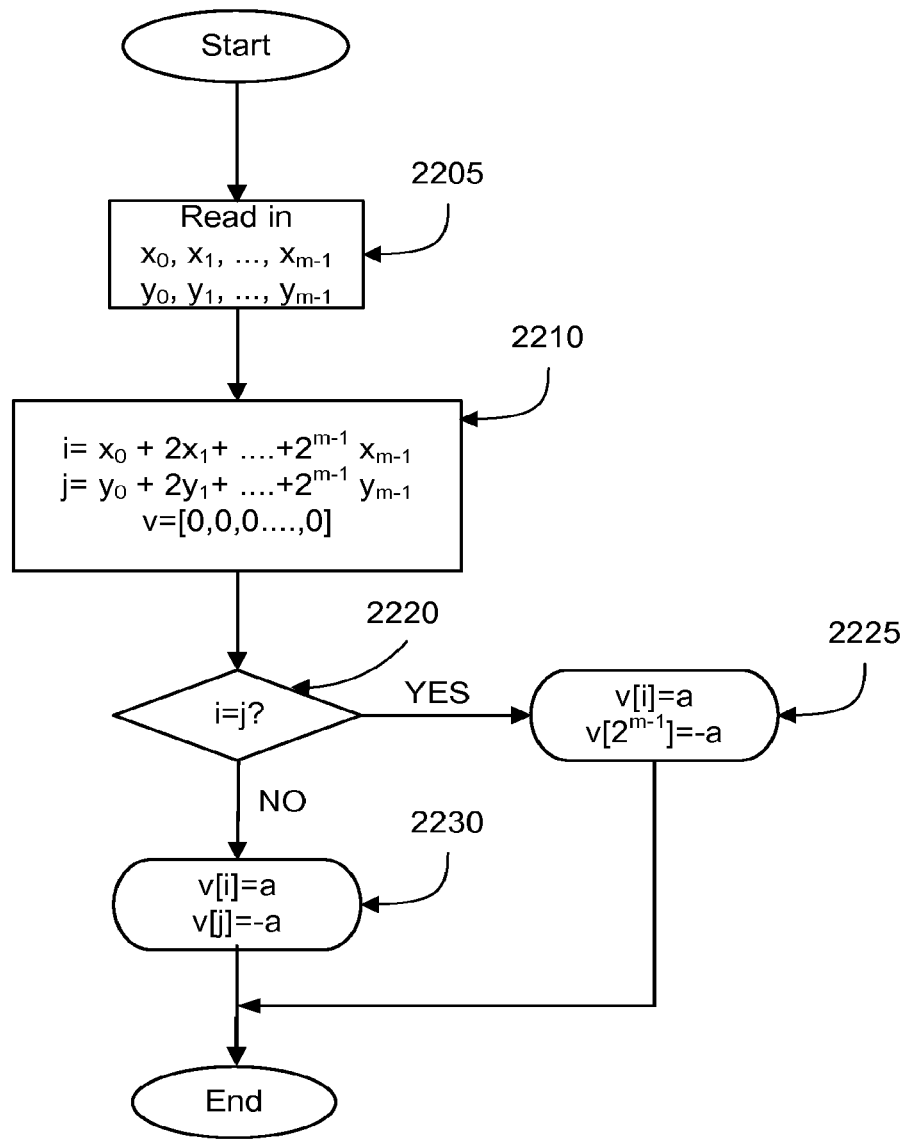
FIG. 22 illustrates an encoding procedure for sparse PM codes; in the procedure of FIG. 22a, the number n is not a power of 2, and m is chosen such that 2 m−1<n<2 m; in the procedure of FIG. 22b, the number n is a power of 2 and m is chosen such that n=2 m+1.
Figure 22B:
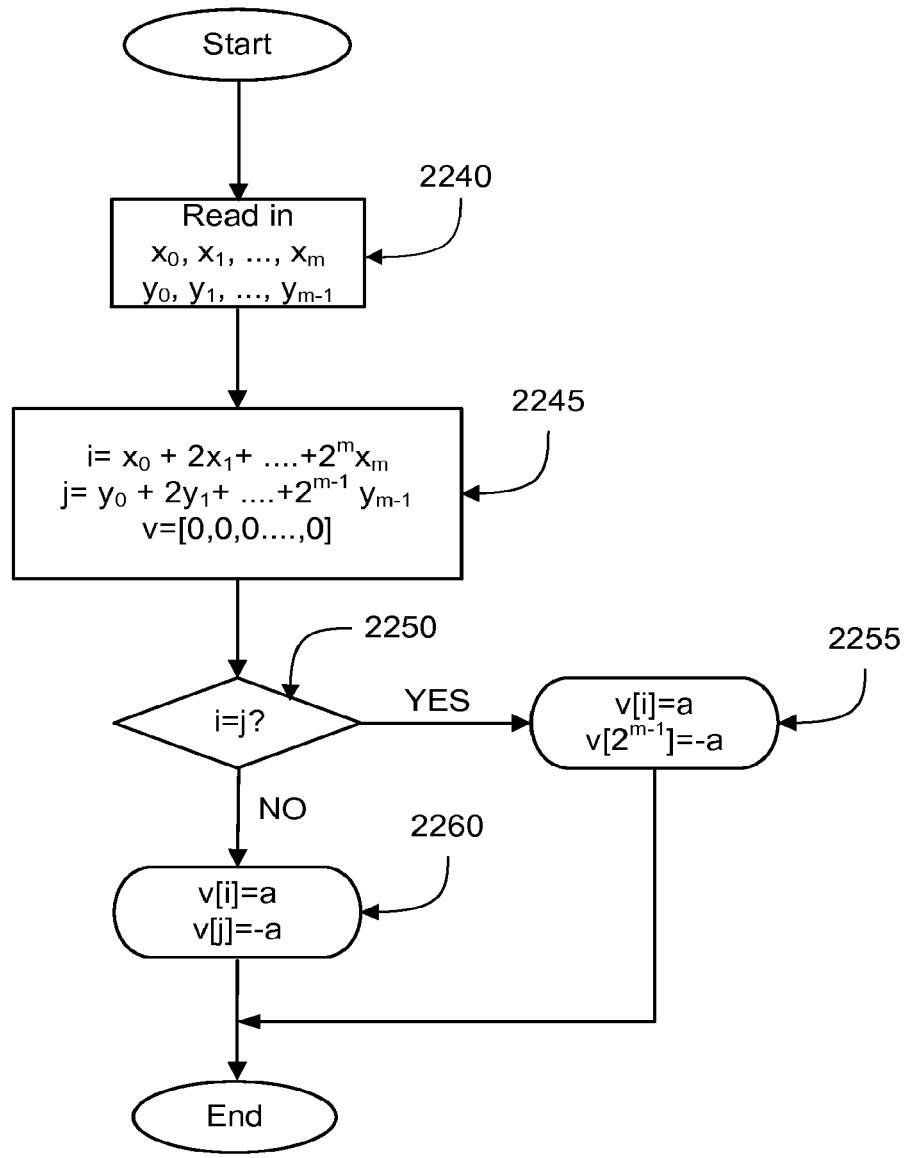
Figure 23:
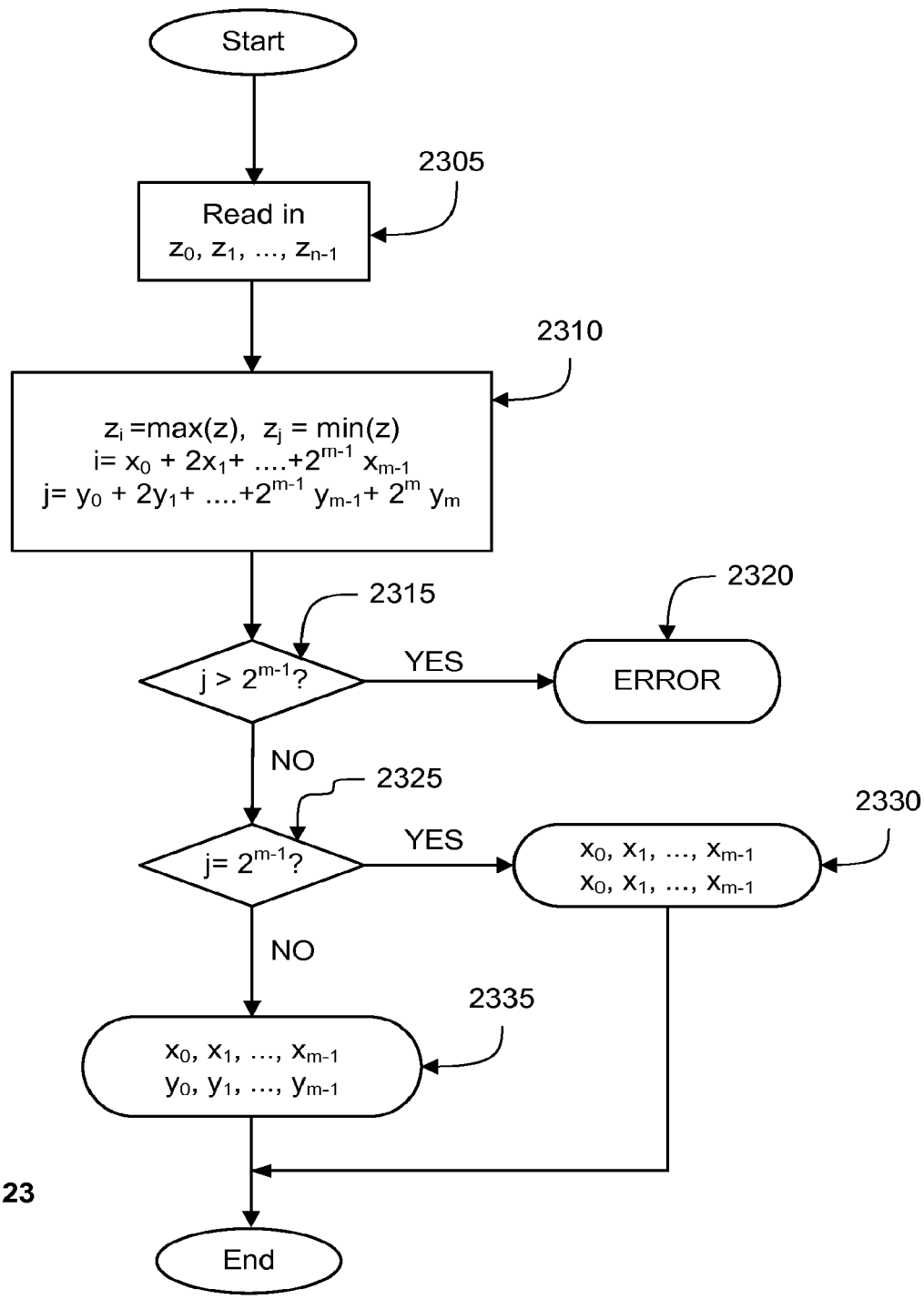
FIG. 23 illustrates a decoding procedure for sparse PM codes, wherein the number n is assumed to not be a power of 2, and m is chosen such that 2 m−1<n<2 m.
Figure 24:
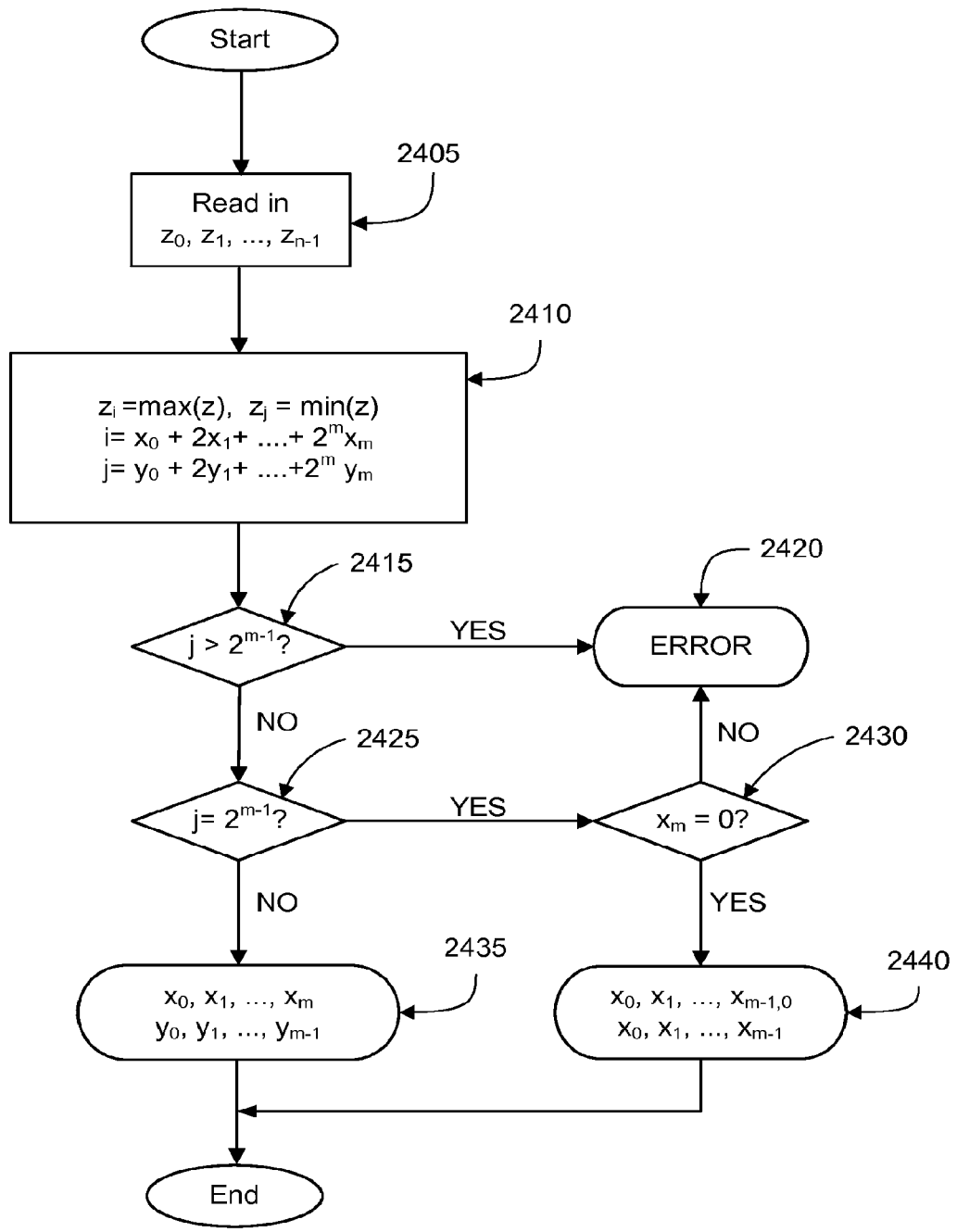
FIG. 24 illustrates a decoding procedure for sparse PM codes, wherein the number n is assumed to be a power of 2, and m is chosen such that n=2 m+1.

Such a method is now disclosed with reference to FIGS. 22-24. In the case of FIG. 22a, the number n is not a power of 2, and m is chosen such that $2^{m-1} < n < 2^m$. The input to this process are two vectors of m bits each, called x and y. The output is a vector v that has only two nonzero coordinates with values a and $-a$. In step 2210, the bits of x and y are used to obtain two indices i and j in the set $\{0, 1, \ldots, 2^m-1\}$. Next, in step 2220, it is checked whether i and j are equal. If so, then v[i] is set to a, and $v[2^m]$ to $-a$. Otherwise, v[i] is set to a, and v[j] to $-a$. All other entries of v are zero because of the initialization in step 2210.

In the case of FIG. 22b, the number n is a power of 2 equal to $2^{m+1}$. The input to this process are two vectors x and y of lengths m+1 and m, respectively. In step 2245, two indices i and j are calculated whose bit-representations are x and y, respectively. In addition, the output vector v is initialized to all zeros. In step 2250, the process tests whether i=j. If so, then v[i] is set to a, whereas $v[2^{m-1}]$ is set to $-a$. If the test in step 2250 is negative, then v[i] is set to a, and v[j] to $-a$.

The decoding procedures are exemplified in FIGS. 23 and 24. Similar to the situation in FIG. 22a, in FIG. 23 the number n is assumed to not be a power of 2, and the number m is such that $2^{m-1} < n < 2^m$. The input to the process in FIG. 23 is a vector $(z_0, z_1, \ldots, z_{n-1})$ of real numbers. In some embodiments, this vector may be what has been received by unit 140 of FIG. 1 after transmission of an element of a PM code on the wires 135. In such embodiments, this vector constitutes a perturbed version of the element of the PM code that was sent by transmitter 120. The task of the process in FIG. 23 is to determine the bit-representation of the transmitted element. In step 2310, two indices i and j are determined such that $z_i$ and $z_j$ are the maximum and the minimum element among $z_0, z_1, \ldots, z_{n-1}$, respectively. In addition, the bit representations of these indices are also determined and stored in vectors x and y as shown. In step 2315, it is checked whether j is bigger than $2^{m-1}$. If so, then there is a decoding error, and the process halts in step 2320, possibly by flagging an error. If the test in step 2315 is negative, then step 2325 checks whether j equals $2^{m-1}$. If so, then the vector $(x_0, \ldots, x_{m-1}, x_0, \ldots, x_{m-1})$ comprising 2 m bits is output in step 2320. If the test in step 2325 is negative, then the vector $(x_0, \ldots, x_{m-1}, y_0, \ldots, y_{m-1})$ is output.

In the situation of FIG. 24, the number n is assumed to be a power of 2, and the number m is such that $n = 2^{m+1}$. The input to the process in this figure is the same as the input to the process in FIG. 23. In step 2410, two indices i and j are determined such that $z_i$ and $z_j$ are the maximum and the minimum element among $z_0, z_1, \ldots, z_{n-1}$, respectively. In addition, the bit representations of these indices are also determined and stored in vectors x and y as shown. The test in step 2415 determines whether j is bigger than $2^{m-1}$. If so, then there is an error, and the process halts in step 2420. If not, then step 2425 tests whether j equals $2^{m-1}$. If so, then step 2430 checks whether $x_m$ equals 0. If not, then the process halts with an error. If yes, then the process outputs, in step 2440, the vector $(x_0, \ldots, x_{m-1}, 0, x_0, \ldots, x_{m-1})$ comprising $2^{m+1}$ bits. If the test in step 2425 is negative, i.e., if j is less than $2^{m-1}$, then the process outputs in step 2435 the vector $(x_0, \ldots, x_m, y_0, \ldots, y_{m-1})$ comprising of 2 m+1 bits.

As can be appreciated by those of skill in the art, the processes described in FIGS. 22-24 are simpler than their counterparts in FIGS. 17 and 19. For example, it is not necessary to completely sort the input vector; only the largest and the smallest elements of this vector need to be determined. In a variety of applications, this can be a lot simpler to accomplish than full sorting.

Many variations of these processes are possible and can be easily obtained upon a careful study of this enclosure. The descriptions given are for illustrative purposes only, and are not meant to be limiting.

Examples of Sparse PM Codes

FIG. 25 gives examples of some sparse PM codes according to the descriptions above. The basic vector corresponding to the PM code is of the form shown in Equation 16.

$$x_0 = (a, \underbrace{0, 0, \ldots, 0}_{n_1}, -a) \qquad \text{(Eqn. 16)}$$

In FIG. 25, the first column is the value of $n_1$, and the second column is the value of a. The third column is the number of bits that are transmitted according to the description above, and n is the number of wires, which is equal to $n_1+2$. The last column gives the improvement in power with respect to differential signaling.

Connections with Constant Weight Coding

Another type of coding which has been used in connection with transmitting signals on a bus of the type presented in FIG. 1 is constant weight coding. In this coding method, only a given number, d, of the wires carry voltages or currents, while the other n-d do not. Constant weight coding has been studied by a large number of researchers. For example [Cornelius] and the references therein describes a constant-weight parallel encoding technique which maintains constant current in the parallel-encoded data lines and the high and low potential driver circuits for the signal lines, and hence can resist various forms of switching noise. [Stan-Burelson] and [Tallini] describe related methods in which a given sequence of bits is transformed into a generally longer sequence of bits in which only exactly d or at most d bits equal one. Such constant weight coding satisfies Equation 2 above, but does not satisfy Equation 1.

Constant weight coding can be viewed as a special case of PM coding, if done properly. For example, it the basic vector $x_0$ is a vector in which the first d coordinates equal some number a (typically equal to 1 in applications) and the residual n-d coordinates equal some other number b (typically equal to 0 in applications), this can work. In particular, the methods described above can also be used to perform encoding and decoding operations for constant-weight codes with the basic vector having at least three distinct coordinates (and not two, as is the case in constant-weight coding). This leads to a much larger pin-efficiency, and resistance to many different types of noise to which constant-weight coding is not resilient.

Multilevel PM Codes

Figure 26:
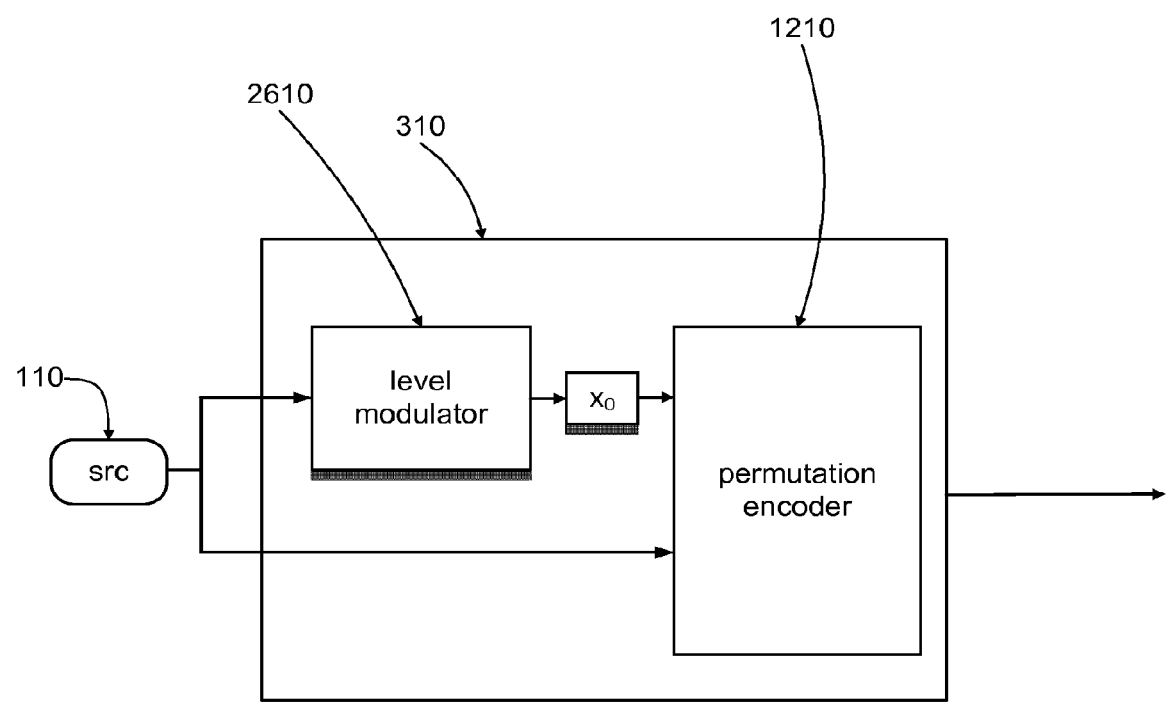
FIG. 26 is a block diagram illustrating an embodiment of the vector signal encoder of FIG. 3 that uses multilevel PM codes.

In some cases, one may want to further increase the pin efficiency of a communication system that builds upon the methods disclosed herein. A way to accomplish this is further explained with reference to FIG. 26. The information source 110 provides a set of d bits to a level modulator 2610. In earlier-described embodiments, the permutation encoder 1210 would use a basic vector $x_0$ for the encoding process. In the multilevel PM codes version, this basic vector is supplied by level modulator 2610 and this vector is referred to as $x_0'$. The task of the level modulator is to modify a basic vector $x_0$ of a PM code in such a way that the value of the d bits is embedded into the basic vector. The modified basic vector is sent to the permutation encoder 1310 that performs permutation modulation encoding based on another set of k bits that is received from the information source 110. The way the bits are embedded may depend on the basic vector $x_0$ referenced in Equation 10.

In a selected embodiment, the basic vector $x_0$ has the property that for $i \neq j$ we have that $a_i \neq a_j$. In that case, a set S is defined where the number of elements of S is given by $2^d$. The level modulator 2710 selects one of the elements of S which we denote by s and produces a basic vector $x_0'$ as shown in Equation 17.

$$x_0' = s \times (\underbrace{a_0, \ldots, a_0}_{n_0} | \underbrace{a_1, \ldots, a_1}_{n_1} | \ldots | \underbrace{a_t, \ldots, a_t}_{n_t}) \quad \text{(Eqn. 17)}$$

One of skill in the art should recognize, from this disclosure, that Equations 1 and 2 remain valid, which implies that embedding information in this manner preserves the excellent common-mode rejection properties of the scheme. The scheme will incur more SSO noise, but the higher number of bits that is transmitter per cycle may be more important than the increased noise. Furthermore, one of skill in the art will recognize that for some PM codes, especially, those that are sparse, the problems with SSO are less severe.

In case there exist indices i and j for which $a_i = a_j$, the level modulator 2710 may produce a basic vector $x_0'$ from $x_0$ as shown in Equation 18, where the set S should be chosen in such a way that the ordering of the elements of the basic vector remains valid, i.e., that $a_0 > a_1 > \ldots > a_i > \ldots > a_j > \ldots > a_t$.

$$x_0 = s \times (\underbrace{a_0, \ldots, a_0}_{n_0} | \underbrace{a_1, \ldots, a_1}_{n_1} | \quad \text{(Eqn. 18)}$$

$$\underbrace{sa_i, \ldots, sa_i}_{n_i} | \ldots | \underbrace{sa_j, \ldots, sa_j}_{n_j} | \underbrace{a_t, \ldots, a_t}_{n_t})$$

It is possible to embed more bits into the PM code by identifying another pair of indices k, l for which $a_k \geq -a_l$ and repeating the same process. The process of embedding more bits into the original PM code may lead to higher error probabilities. However, to overcome this, the bits supplied by 110 can be encoded with an error-correcting code before passing them to the vector signal encoder.

It should be apparent from this description that each of the features and/or functions described herein in mathematical terms, such as equations, inequalities, relations and functions, and/or in programmatic terms, such as a sequence of operations, can be implemented in some physical manner, such as by the use of hardware circuits that effect the operations represented by those features and/or functions. As such, particular description of specific hardware elements, such as wires, resistors, transistors, active or passive electronic components, is not required for a full understanding of the inventions and embodiments described herein.

Some features and/or functions might be implemented by program code or instructions executed by a programmable processor or general purpose computer. However, it should be understood that in some cases, that would be impractical. For example, where the communications is over a bus between two chips with low power limits and pin constraints, it might make no sense to spend more power running a programmable processor using up more power than would be saved relative to a basic chip-to-chip communications channel that did none of the operations described herein.

Of course, some operations that can be done ahead of time, such as generating tables of values and storing them in memory for repeated use, or configuring an FPGA one time, might be done ahead of time to allow for the encoding and decoding to proceed efficiently and with lower power consumption per transmission period than otherwise. Of course, where chip-to-chip communications are involved, there may also be constraints on how much chip real estate is available for the encoders and decoders.

In the foregoing specification, the invention has been described with reference to specific embodiments thereof. It will be, however, evident that various modifications and changes may be made thereto without departing from the broader scope and spirit of the invention. The specifications and drawings are, accordingly, to be regarded in an illustrative, rather than restrictive, sense.

What is claimed is:

1. An apparatus comprising:
   a code map unit configured to receive k source bits as a code map unit input and to generate a first set of n values where the sum of the squares of the values is predetermined;
   a transform unit connected to the code map unit and configured to receive the first set of n values and to generate a second set of n values; and, a modulator configured to generate a modulated signal output based on the second set of n values.

2. The apparatus of claim 1 wherein the code map unit performs an encoding in a spherical code.

3. The apparatus of claim 1 wherein the code map unit comprises an error correcting code generator.

4. The apparatus of claim 1 wherein the transform unit utilizes a Hadamard transform.

5. The apparatus of claim 1 wherein the code map unit performs an encoding in a Hamming code and the transform unit utilizes a Hadamard transform, collectively comprising an encoding of the k source bits in a permutation modulation code.

6. The apparatus of claim 5 where the permutation modulation code is a sparse code.

7. The apparatus of claim 1 wherein the transform unit preserves mutual distance properties between the first set of n values and the second set of n values.

8. The apparatus of claim 1 wherein the transform unit implements a matrix transform wherein the matrix has mutually orthogonal columns.

9. The apparatus of claim 1, further comprising a system bus having a plurality of microstrips and wherein the modulated signal output is applied to the system bus.

10. The apparatus of claim 1, wherein the modulator is a pulse amplitude modulator.

11. A method comprising:
receiving k source bits at a code map unit and generating a first set of n values where the sum of the squares of the values is predetermined;
receiving the first set of n values from the code map unit at a transform unit and responsively generating a second set of n values; and,
generating a modulated signal output from a modulator based on the second set of n values.

12. The method of claim 11 wherein generating the first set of n values is done using a spherical code.

13. The method of claim 11 wherein the code map unit generates an error correcting code.

14. The method of claim 11 wherein the second set of n values is generated using a Hadamard transform.

15. The method of claim 11 wherein the first set of n values is a Hamming code and wherein the second set of n values is formed using a Hadamard transform, which collectively comprise an encoding of the k source bits into a permutation modulation code.

16. The method of claim 15 where the permutation modulation code is a sparse code.

17. The method of claim 11 wherein the transform unit preserves mutual distance properties between the first set of n values and the second set of n values.

18. The method of claim 11 wherein the second set of n values is formed via a matrix transform wherein the matrix has mutually orthogonal columns.

19. The method of claim 11, wherein the modulated signal output is applied to a system bus comprising a plurality of microstrips.

20. The method of claim 11, wherein the modulated signal output is formed with a pulse amplitude modulator.

* * * * *